US012666983B2

(12) United States Patent
Ono et al.

(10) Patent No.: US 12,666,983 B2
(45) Date of Patent: Jun. 23, 2026

(54) SEMICONDUCTOR DEVICE

(71) Applicant: SONY GROUP CORPORATION, Tokyo (JP)

(72) Inventors: Koichi Ono, Kanagawa (JP); Mika Kotanagi, Tokyo (JP)

(73) Assignee: Sony Group Corporation, Tokyo (JP)

( * ) Notice: Subject to any disclaimer, the term of this patent is extended or adjusted under 35 U.S.C. 154(b) by 391 days.

(21) Appl. No.: 18/253,422

(22) PCT Filed: Oct. 1, 2021

(86) PCT No.: PCT/JP2021/036399
§ 371 (c)(1),
(2) Date: May 18, 2023

(87) PCT Pub. No.: WO2022/113519
PCT Pub. Date: Jun. 2, 2022

(65) Prior Publication Data
US 2024/0006294 A1 Jan. 4, 2024

(30) Foreign Application Priority Data

Nov. 25, 2020 (JP) ................................. 2020-194786

(51) Int. Cl.
*H10W 70/65* (2026.01)
*H10W 70/60* (2026.01)
(Continued)

(52) U.S. Cl.
CPC ......... *H10W 70/65* (2026.01); *H10W 70/685* (2026.01); *H10W 90/00* (2026.01);
(Continued)

(58) Field of Classification Search
CPC ...... H10W 70/00; H10W 72/00; H10W 90/00
See application file for complete search history.

(56) References Cited

U.S. PATENT DOCUMENTS 9,922,964 B1 3/2018 Chen et al.
10,304,801 B2 5/2019 Huang et al.
(Continued)

FOREIGN PATENT DOCUMENTS

JP 2002-170826 6/2002
JP 2005-277429 10/2005
(Continued)

OTHER PUBLICATIONS

International Search Report and Written Opinion prepared by the Japan Patent Office on Nov. 29, 2021, for International Application No. PCT/JP2021/036399, 3 pgs.

*Primary Examiner* — Marvin Payen
(74) *Attorney, Agent, or Firm* — SHERIDAN ROSS P.C.

(57) ABSTRACT

Reliability is improved in a semiconductor device. The semiconductor device includes a wiring layer, a semiconductor chip stacked in a predetermined region on a wiring surface of the wiring layer, and a signal line that is wired on the wiring surface and has an angle less than a predetermined angle in at least one of two regions divided by any boundary line of the predetermined region, the angle being formed when the signal line crosses the boundary line. The semiconductor chip is stacked in a predetermined region on the wiring surface of the wiring layer. The signal line is wired on the wiring surface and has an angle less than the predetermined angle in at least one of two regions divided by any boundary line of the predetermined region, the angle being formed when the signal line crosses the boundary line.

20 Claims, 33 Drawing Sheets

(51) Int. Cl.

| | | |
|---|---|---|
| *H10W 70/685* | (2026.01) | |
| *H10W 72/00* | (2026.01) | |
| *H10W 90/00* | (2026.01) | |

(52) U.S. Cl.

CPC .......... *H10W 90/734* (2026.01); *H10W 70/60* (2026.01); *H10W 72/0198* (2026.01); *H10W 72/877* (2026.01); *H10W 90/722* (2026.01); *H10W 90/724* (2026.01); *H10W 90/754* (2026.01)

(56)     References Cited

U.S. PATENT DOCUMENTS

| | | | |
|---|---|---|---|
| 10,475,768 B2 | 11/2019 | Hsieh et al. | |
| 2002/0074656 A1 | 6/2002 | Ujiie et al. | |
| 2014/0124941 A1 | 5/2014 | Sakamoto | |
| 2016/0204058 A1 | 7/2016 | Oyamada | |
| 2018/0076175 A1* | 3/2018 | Hsieh ...................... | H01L 21/56 |
| 2018/0122774 A1 | 5/2018 | Huang | |

FOREIGN PATENT DOCUMENTS

| | | |
|---|---|---|
| JP | 2018-026484 | 2/2018 |
| JP | 2019-075444 | 5/2019 |
| WO | WO 2013/057867 | 4/2013 |

* cited by examiner

*FIG. 35*

SEMICONDUCTOR DEVICE

CROSS REFERENCE TO RELATED APPLICATIONS

This application is a national stage application under 35 U.S.C. 371 and claims the benefit of PCT Application No. PCT/JP2021/036399, having an international filing date of 1 Oct. 2021, which designated the United States, which PCT application claimed the benefit of Japanese Patent Application No. 2020-194786, filed 25 Nov. 2020, the entire disclosures of each of which are incorporated herein by reference.

TECHNICAL FIELD

The present technology relates to a semiconductor device. Specifically, the present technology relates to a semiconductor device including a semiconductor package.

BACKGROUND ART

Conventionally, development and research for enhancing an integration density of an electronic device (transistor, diode, resistor, capacitor, and the like) using a semiconductor material and a semiconductor die (semiconductor chip) on which the electronic device is mounted have been advanced. For example, there has been proposed a semiconductor device having a package on package (PoP) structure in which a package is connected to another package in which a semiconductor chip is stacked on a wiring layer (see, for example, Patent Document 1).

CITATION LIST

Patent Document

Patent Document 1: U.S. Pat. No. 9,922,964

SUMMARY OF THE INVENTION

Problems to be Solved by the Invention

In the above conventional technology, the integration density is enhanced by the PoP structure. However, in the semiconductor device described above, stress (shear stress or the like) might be concentrated near a boundary of a region where the semiconductor die is stacked due to heat treatment or the like during a manufacturing process. There is a possibility that, due to this stress, a failure such as disconnection of a signal line in the wiring layer occurs, and reliability of the semiconductor device is deteriorated.

The present technology is achieved in view of such a situation, and an object of the present technology is to improve reliability in a semiconductor device in which a semiconductor chip is stacked on a wiring layer.

Solutions to Problems

The present technology has been made to solve the above problem and a first aspect of the present technology is a semiconductor device including a wiring layer, a semiconductor chip stacked in a predetermined region on a wiring surface of the wiring layer, and a signal line that is wired on the wiring surface and has an angle less than a predetermined angle in at least one of two regions divided by any boundary line of the predetermined region, the angle being formed when the signal line crosses the boundary line. This configuration provides an effect of preventing disconnection due to stress.

Furthermore, in the first aspect, the signal line may include a predetermined number of segments, and any of the predetermined number of segments may intersect the boundary line and have an angle with respect to the boundary line, the angle being less than the predetermined angle. This configuration provides an effect of preventing disconnection due to stress near the boundary line.

Furthermore, in the first aspect, the signal line may include a predetermined number of segments, and one end of any of the predetermined number of segments may coincide with a predetermined point on the boundary line and have an angle with respect to the boundary line, the angle being less than the predetermined angle. This configuration provides an effect of preventing disconnection due to stress near the boundary line.

Furthermore, in the first aspect, the signal line may include a plurality of segments including a specific segment whose angle with respect to the boundary line is less than the predetermined angle, and a width of the specific segment among the plurality of segments may be wider than a width of a segment that does not correspond to the specific segment among the plurality of segments. This configuration provides an effect of improving stress resistance.

Furthermore, in the first aspect, the signal line may include a predetermined number of segments, and an angle between the boundary line and all of the segments in a region where a distance from the boundary line is within a predetermined value may be less than the predetermined angle. This configuration provides an effect of preventing disconnection due to stress near the boundary line.

Furthermore, in the first aspect, the signal line connects a pair of terminals, and a redundant signal line connecting the pair of terminals and having a different wiring path from the signal line is further wired in the wiring layer. This configuration provides an effect of making the wiring redundant.

Furthermore, in the first aspect, the signal line may be wired via a relay via provided on the boundary line. This configuration provides an effect of making the wiring redundant.

Furthermore, in the first aspect, a dielectric layer provided with an external terminal, a conductive material of which one of both surfaces is connected to the external terminal, and a seed layer may be further included, and another of the both surfaces of the conductive material may have a first portion in contact with the dielectric layer and a second portion in non-contact with the seed layer. This configuration provides an effect of relaxing the stress.

Furthermore, in the first aspect, an end surface of the conductive material may be tapered. This configuration provides an effect of relaxing the stress.

Furthermore, in the first aspect, the conductive material may include a plurality of lands and linear lines. This configuration provides an effect of improving stress resistance.

Furthermore, in the first aspect, the wiring layer may include a signal line region in which the signal line is wired, and a power supply ground region to which at least one of a power supply or a ground to the semiconductor chip is supplied. This configuration provides an effect of improving power supply stability and stress resistance.

Furthermore, in the first aspect, at least one of a power supply line or a ground line may be wired in a mesh shape in the power supply ground region. This configuration provides an effect of improving power supply stability and stress resistance.

Furthermore, in the first aspect, a solid pattern may be formed in the power supply ground region. This configuration provides an effect of improving power supply stability and stress resistance.

Furthermore, in the first aspect, an angle formed by a boundary between each of the signal line region and the power supply ground region and the boundary line may be different from 90 degrees. This configuration provides an effect of improving wiring efficiency.

Furthermore, in the first aspect, the wiring layer and the semiconductor chip may be provided in a wafer level chip size package (WCSP). This configuration provides an effect of improving reliability of the WCSP.

Furthermore, in the first aspect, the wiring layer and the semiconductor chip may be provided in a fine pitch ball grid array (FBGA) package. This configuration provides an effect of improving reliability of the FBGA package.

Furthermore, in the first aspect, the wiring layer may be formed in an interposer substrate. This configuration provides an effect of improving reliability of the interposer substrate.

BRIEF DESCRIPTION OF DRAWINGS

FIG. 35 is a block diagram depicting an example of a schematic configuration of a vehicle control system.

MODE FOR CARRYING OUT THE INVENTION

Hereinafter, embodiments for implementing the present technology (hereinafter referred to as embodiments) will be described. The description will be made in the following order.

1. First embodiment (example in which angle of segment with respect to boundary line is less than predetermined angle)
2. Second embodiment (example in which conductive material has portion in contact with seed layer and portion in non-contact with seed layer)
3. Third embodiment (example in which width of segment intersecting boundary line is increased)
4. Fourth embodiment (example in which angle of all segments near boundary line with respect to boundary line is less than predetermined angle)
5. Fifth embodiment (example in which wiring pattern is redundant)
6. Sixth embodiment (example in which power supply and ground are formed in mesh shape or solid shape)
7. Seventh embodiment (example in which semiconductor device includes package other than PoP structure)
8. Example of application to mobile body

1. First Embodiment

Configuration Example of Semiconductor Device

Figure 1:
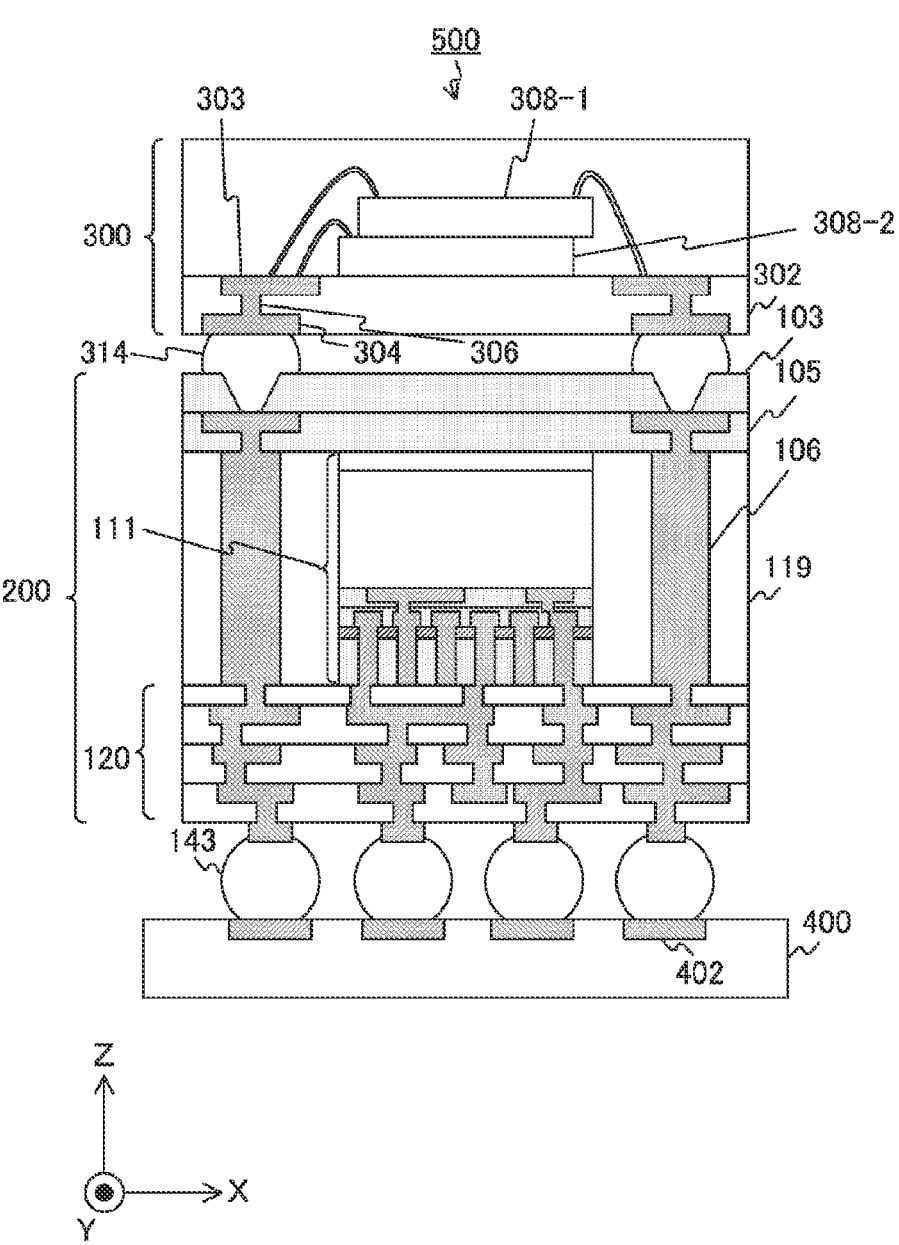
FIG. 1 is an example of a sectional view of a semiconductor device according to a first embodiment of the present technology.

FIG. 1 is an example of a sectional view of a semiconductor device 500 according to a first embodiment of the present technology. The semiconductor device 500 includes packages 200 and 300 and a package substrate 400.

Hereinafter, an axis parallel to a stacking direction of the packages 200 and 300 is defined as a Z axis. A predetermined axis perpendicular to the Z axis is defined as an X axis, and an axis perpendicular to the X axis and the Z axis is defined as a Y axis. The drawing is a sectional view when viewed from a direction of the Y axis.

The package 200 includes a substrate 302 and stacked dies 308-1 and 308-2 coupled to the substrate 302. Note that the number of stacked dies is not limited to two, and may be one or the like. In addition, the substrate 302 may also include an active device and a passive device (not shown).

Furthermore, the substrate 302 includes a through via 306, and may further include a wiring layer (not shown). The wiring layer may be formed on the active device and the passive device, and is designed to connect various devices to form a functional circuit. The wiring layer may be formed by alternating layers with vias that interconnect layers of dielectric (for example, a low dielectric material) and conductive material (for example, copper), and is formed by any suitable processing (vapor deposition, damascene, dual damascene, or the like).

A bond pad 303 is formed on one of both surfaces of the substrate 302, and a bond pad 304 is formed on the other surface. The bond pad 303 is used to couple to the stacked dies 308-1 and 308-2. The bond pad 304 is used to couple to the package 200.

The bond pads 303 and 304 may be formed by depositing a conductive material on a thin seed layer (not shown) of copper, titanium, nickel, gold, palladium, or a combination thereof. The conductive material may be formed by an electrochemical plating method, an electroless plating method, a chemical vapor deposition (CVD) method, an atomic layer deposition (ALD) method, a physical vapor deposition (PVD) method, or the like, or a combination thereof. Examples of the conductive material of the bond pads 303 and 304 include copper, tungsten, aluminum, silver, gold, or a combination thereof.

The package substrate 400 includes a semiconductor material such as silicon. The package substrate 400 may also include an active device and a passive device (not shown). The package substrate 400 may also include a wiring layer and a via (not shown) and a bond pad 402.

A conductive connector 143 is reflowed to attach the package 200 to the bond pad 402.

An underfill (not shown) surrounding the conductive connector 143 may be formed between the package 200 and the package substrate 400. The underfill may be formed by a capillary flow processing after the package 200 is attached, or may be formed by a suitable vapor deposition method before the package 200 is attached.

The package 200 includes a frontside rewiring layer 120, an integrated circuit die 111, a through via 106, an encapsulant 119, a dielectric layer 103, a dielectric layer 105, and a conductive connector 314.

One of both surfaces of the frontside rewiring layer 120 is connected to the conductive connector 143, and the integrated circuit die 111 which is a rectangular semiconductor chip is stacked on the other surface. Note that the frontside rewiring layer 120 is an example of a wiring layer described in the claims, and the integrated circuit die 111 is an example of a semiconductor chip described in the claims.

Furthermore, of both surfaces of the frontside rewiring layer 120, the surface on which the integrated circuit die 111 is stacked is connected to the dielectric layer 105 via the through via 106 penetrating the encapsulant 119.

The dielectric layer 103 is stacked on the dielectric layer 105. The conductive connector 314 is formed in an opening of the dielectric layer 103. The conductive connector 314 is connected to the package 300.

Figure 2:
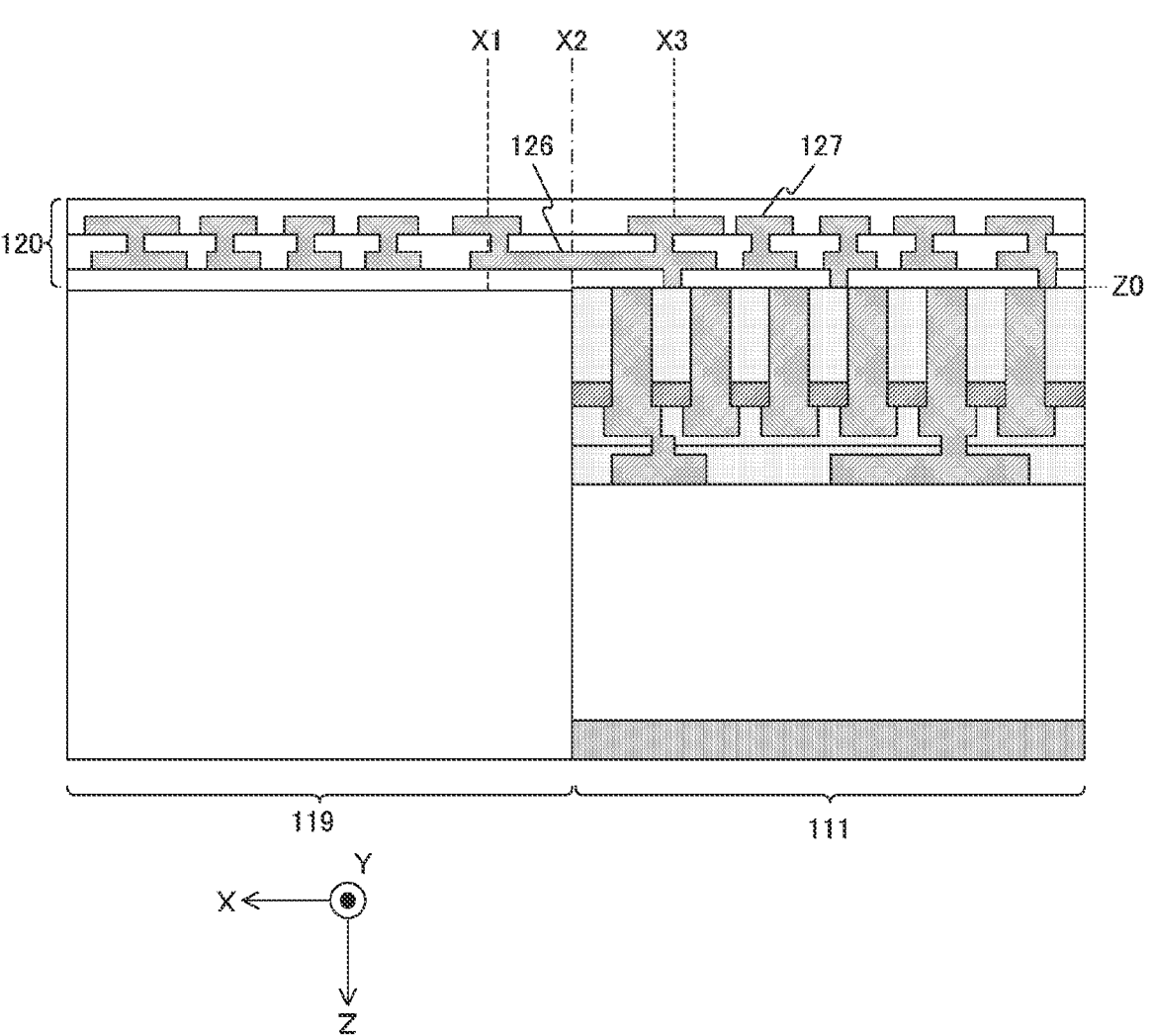
FIG. 2 is an example of a sectional view of a frontside rewiring layer and an integrated circuit die according to the first embodiment of the present technology.

FIG. 2 is an example of a sectional view of the frontside rewiring layer 120 and the integrated circuit die 111 according to the first embodiment of the present technology. In the drawing, the integrated circuit die 111 is stacked in a partial region of the frontside rewiring layer 120, and the encapsulant 119 and a through via (not shown) are provided in the remaining region. In addition, in the drawing, the frontside rewiring layer 120 is shown in a simplified manner as compared with the configuration illustrated in FIG. 1.

Furthermore, in the rewiring layer 120, signal lines are wired by the wiring pattern 126 and the like on an X-Y plane in the drawing. The integrated circuit die 111 is stacked in a partial region on this plane (wiring surface), and the encapsulant 119 is formed in the remaining region. In the drawing, a boundary line of the region where the integrated circuit die 111 is stacked in the X-Y plane of the rewiring layer 120 includes a point of coordinates (X2, Z0) and corresponds to a straight line extending along the Y axis. Then, in the rewiring layer 120, the signal lines are wired by the wiring pattern 126 across the boundary line.

Here, stress might concentrate near the boundary line of the region where the integrated circuit die 111 is stacked. For example, during heat treatment or the like in a manufacturing process, a shear stress might be generated near the boundary line along a Z direction due to a difference in coefficient of thermal expansion (CTE) of each member. For example, stress concentrates in a region from a coordinate X1 to a coordinate X3.

Figure 3:
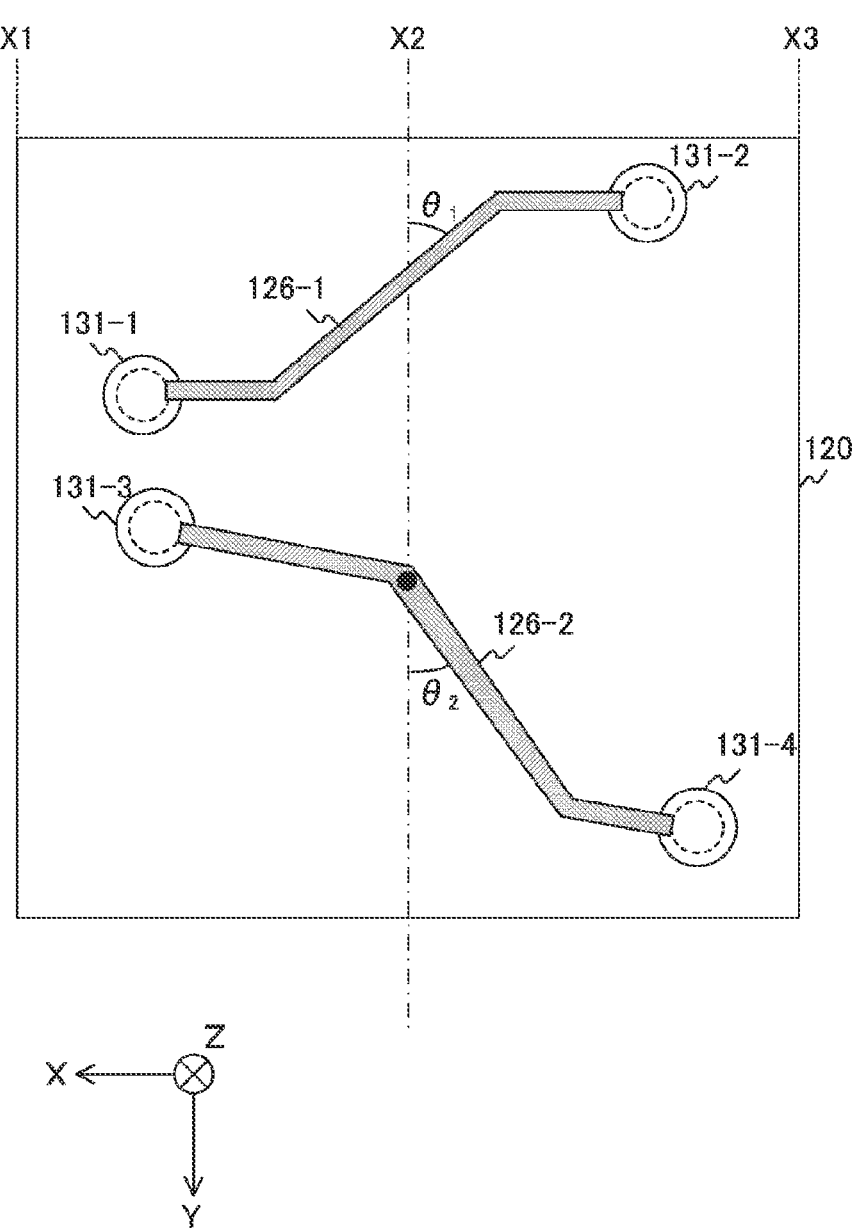
FIG. 3 is a plan view depicting an example of a wiring pattern according to the first embodiment of the present technology.

FIG. 3 is a plan view depicting an example of a wiring pattern according to the first embodiment of the present technology. The drawing is a plan view of a region from coordinates X1 to X3 of the frontside rewiring layer 120 when viewed from a direction of the Z axis. Although the frontside rewiring layer 120 includes two or more stacked dielectric layers, only one of the dielectric layers is illustrated in the drawing. Conductive vias 131-1 and 131-3 are formed between the coordinates X1 and X2, and conductive vias 131-2 and 131-4 are formed between the coordinates X2 and X3. Furthermore, the signal lines 126-1 and 126-2 are formed by the wiring pattern 126.

The signal line 126-1 connects the conductive via 131-1 and the conductive via 131-2 across the boundary line of the region where the integrated circuit die 111 is stacked. The signal line 126-2 connects the conductive via 131-3 and the conductive via 131-4 across the boundary line.

A wiring path of the signal line 126-1 can be divided into a plurality of (for example, three) line segments. Each of the line segments when the wiring path is divided is hereinafter referred to as a segment. These segments include a specific segment intersecting the boundary line, and an angle θ1 formed by the segment and the boundary line is less than a predetermined angle (for example, 50 degrees). In addition, a wiring path of the signal line 126-2 includes a bending point at which an angle with respect to the boundary line is bent in a direction of less than a predetermined angle (for example, 50 degrees) on the boundary line. A black circle in the drawing indicates a bending point. The segment extending rightward from the bending point as a starting point has one end substantially coinciding with a predetermined point on the boundary line (intersection between the wiring path and the boundary line), and an angle with respect to the boundary line being less than a predetermined angle (for example, 50 degrees). Note that the angle between the segment extending leftward from the bending point and the boundary line is not required to be less than the predetermined angle. That is, when the wiring path is bent at the boundary line, an angle with respect to at least one boundary line of a segment extending to one of two regions divided by the boundary line (leftward) and a segment extending to the other of the two regions (rightward) is only required to be less than the predetermined angle. As described above, on the wiring surface of the frontside rewiring layer 120, the signal lines 126-1 and 126-2 are wired in which the angle formed when the signal lines cross the boundary line in at least one of the two regions divided by any boundary line of the region where the semiconductor die 111 is stacked is less than the predetermined angle.

In these cases, it has been found that there is also an effect of reducing a disconnection rate as compared with a case where a linear wiring path is formed perpendicular to the boundary line. It is considered that the stress at the boundary line is mainly generated in a direction perpendicular to the boundary surface because a sectional length along the boundary line of the wiring path is about two and a half times or more in the example of the signal line 126-1. The reason is that, in the example of the signal line 126-2, the strength of the wiring path at the bending point is stronger than the strength of a linear wiring path. Note that, in the present embodiment, the angle with respect to the boundary line is set to less than 50 degrees, but in terms of only stress resistance, it can be said that the angle is preferably close to 0 degrees. However, it is preferable to set the angle to 30 degrees to 50 degrees in terms of balance with wiring efficiency.

Method for Manufacturing Semiconductor Device

Next, a method for manufacturing the semiconductor device 500 will be described with reference to FIGS. 4 to 17.

Figure 4:
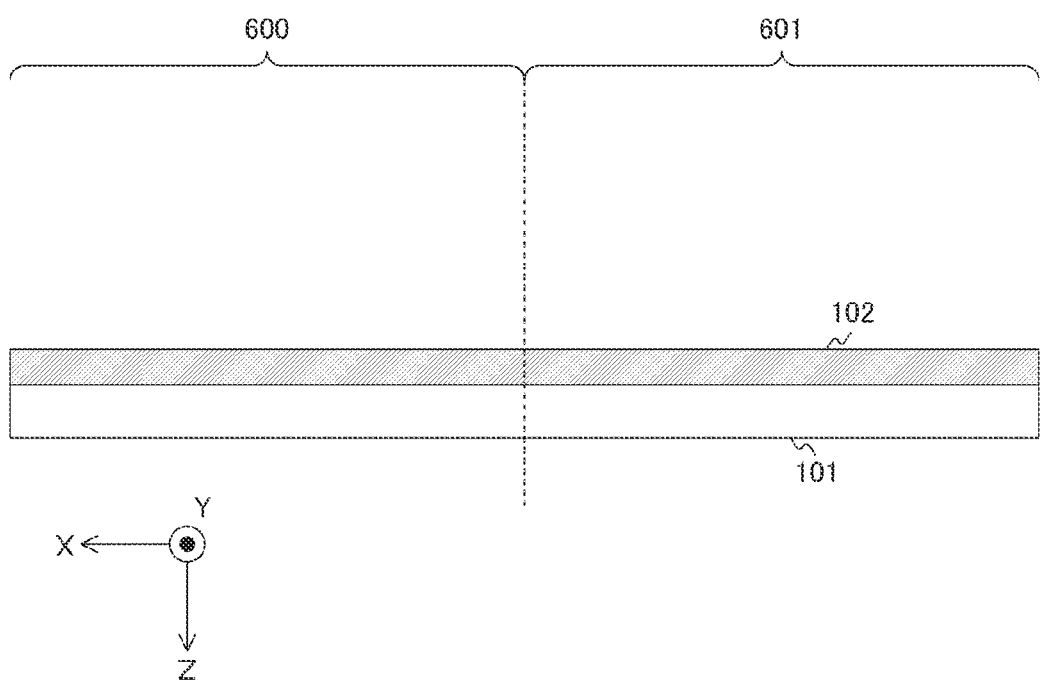
FIG. 4 is a diagram depicting a carrier substrate and a release layer 102 formed on the carrier substrate according to the first embodiment of the present technology.

FIG. 4 is a diagram depicting a carrier substrate 101 and a release layer 102 formed on the carrier substrate 101 according to the first embodiment of the present technology. Package regions 600 and 601 for forming the package 200 are shown.

The carrier substrate 101 may include glass or ceramic, or may be a wafer on which a plurality of packages can be simultaneously formed on the carrier substrate 101. The release layer 102 is formed on the carrier substrate 101. The release layer 102, along with the carrier substrate 101, may be removed from a structure body formed in a subsequent step. An example of a material for the release layer 102 is an epoxy-based thermal release material that loses its adhesion when heated, such as, for example, a light-to-heat conversion release coating (LTHC). Another example is an ultra-violet (UV) adhesive that loses its adhesiveness when exposed to ultraviolet light. The release layer 102 may be discharged as a liquid and cured, or may be a laminate film laminated on the carrier substrate 101. An upper surface of the release layer 102 may be flattened.

Figure 5:
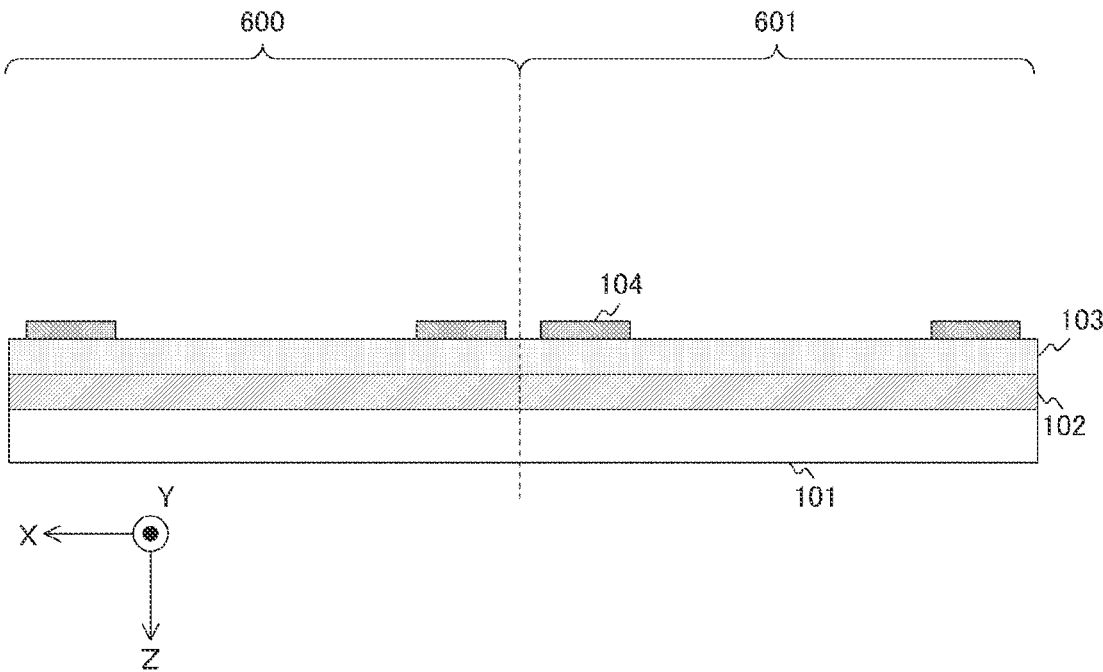
FIG. 5 is a diagram for describing a process of forming a dielectric layer and a wiring pattern according to the first embodiment of the present technology.

Next, as illustrated in FIG. 5, the dielectric layer 103 and the wiring pattern 104 are formed. The dielectric layer 103 is formed on the release layer 102. An example of a material of the dielectric layer 103 is a polymer such as polybenzo-xazole (PBO), polyimide, or benzocyclobutene (BCB). Other examples include nitrides such as silicon nitride. In addition, examples of the material include oxides such as silicon oxide, phosphorous silicate glass (PSG), borosilicate glass (BSG), and boro-phospho silicate glass (BPSG). The dielectric layer 103 is formed by any acceptable deposition processing, such as spin coating, chemical vapor deposition (CVD), lamination, or a combination thereof.

The wiring pattern 104 is formed on the dielectric layer 103. An example of a method for forming the wiring pattern 104 includes a method for forming a seed layer (not shown) on the dielectric layer 103. The seed layer is a metal layer, which may include a single layer or multiple layers including different materials. An example of the seed layer includes a titanium layer and a copper layer on the titanium layer. The seed layer may be formed by, for example, PVD or the like. An optimum thickness of the seed layer for forming the wiring pattern is from 50 nanometers (nm) to 200 nanometers (nm).

Thereafter, a photoresist is formed and patterned on the seed layer. The photoresist is formed by spin coating or the like. The pattern of the photoresist is formed corresponding to the wiring pattern 104. Patterning forms an opening in the photoresist to expose the seed layer. A conductive material is formed in the opening of the photoresist and the exposed portion of the seed layer. The conductive material is formed by plating such as electrolytic plating or electroless plating. The conductive material may include a metal such as copper, titanium, tungsten, or aluminum. Thereafter, the photoresist is removed by ashing treatment using oxygen plasma or the like. Thereafter, the exposed portion of the seed layer is then removed, for example, by using etching processing such as wet etching or dry etching. The seed layer and the remaining portion of the conductive material form the wiring pattern 104.

As described below, the conductive material may have a first portion in contact with the seed layer and a second portion in non-contact with the seed layer. With this configuration, since the seed layer is not formed immediately below the second portion of the conductive material, the wiring pattern 104 can be deformed or moved following stress from outside, and the stress can be effectively relaxed. In addition, in a case where an external terminal or a via such as a through via, a conductive pillar, or a solder ball to be described later is formed on the wiring pattern 104, stress applied to a root of the external terminal or the via can be reduced.

Figure 6:
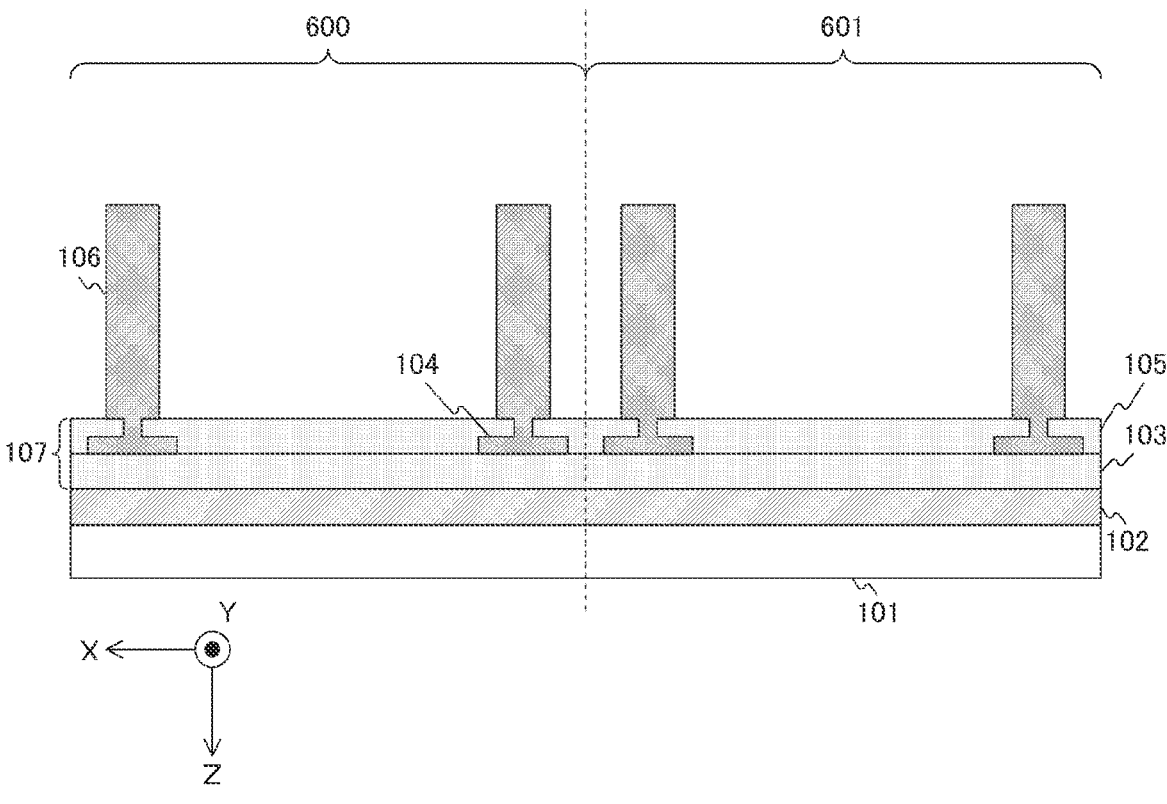
FIG. 6 is a diagram for describing a process of forming a dielectric layer and a through via according to the first embodiment of the present technology.

In FIG. 6, the dielectric layer 105 is formed on the wiring pattern 104 and the dielectric layer 103. The dielectric layer 105 includes a material similar to the material of the dielectric layer 103, and is patterned by using a lithography mask. Thereafter, the dielectric layer 105 is patterned so as to form an opening for exposing a part of the wiring pattern 104. In a case where the dielectric layer is a photosensitive material, patterning is performed by exposing the dielectric layer 105 to light, or by processing such as etching using, for example, anisotropic etching.

Note that the dielectric layers 103 and 105 and the wiring pattern 104 may be referred to as a backside rewiring layer 107. As shown in the drawing, the backside rewiring layer 107 includes two dielectric layers 103 and 105 and one wiring pattern 104. The backside rewiring layer 107 can include any number of dielectric layers, wiring patterns, and vias. By repeating the process of forming the wiring pattern 104 and the dielectric layer 105, one or more additional wiring patterns and dielectric layers can be formed in the backside rewiring layer 107. The via is formed during formation of the wiring pattern by forming the seed layer of the wiring pattern and the conductive material in an opening of an underlying dielectric layer. The via connects vertically adjacent wiring patterns to each other.

Furthermore, in FIG. 6, the through via 106 is formed. As an example for forming the through via 106, as shown in the drawing, a seed layer (not shown) is formed on, for example, the exposed portion of the dielectric layer 105 and the wiring pattern 104 in the backside rewiring layer 107 by using the above material and processing. Thereafter, a photoresist is formed by using the above material and processing and patterned on the seed layer. The pattern of the photoresist is formed corresponding to a through-via. A conductive material is formed in the opening of the photoresist and the exposed portion of the seed layer by using the above material and processing. Thereafter, the photoresist and a part of the seed layer on which the conductive material is not formed are removed. The seed layer may be removed by wet etching using a conductive material as a mask. Furthermore, as described below, the conductive material may have a first portion in contact with the seed layer and a second portion in non-contact with an underlayer. The remaining seed layer and conductive material become the through via 106 and the wiring pattern (not shown).

Figure 7:
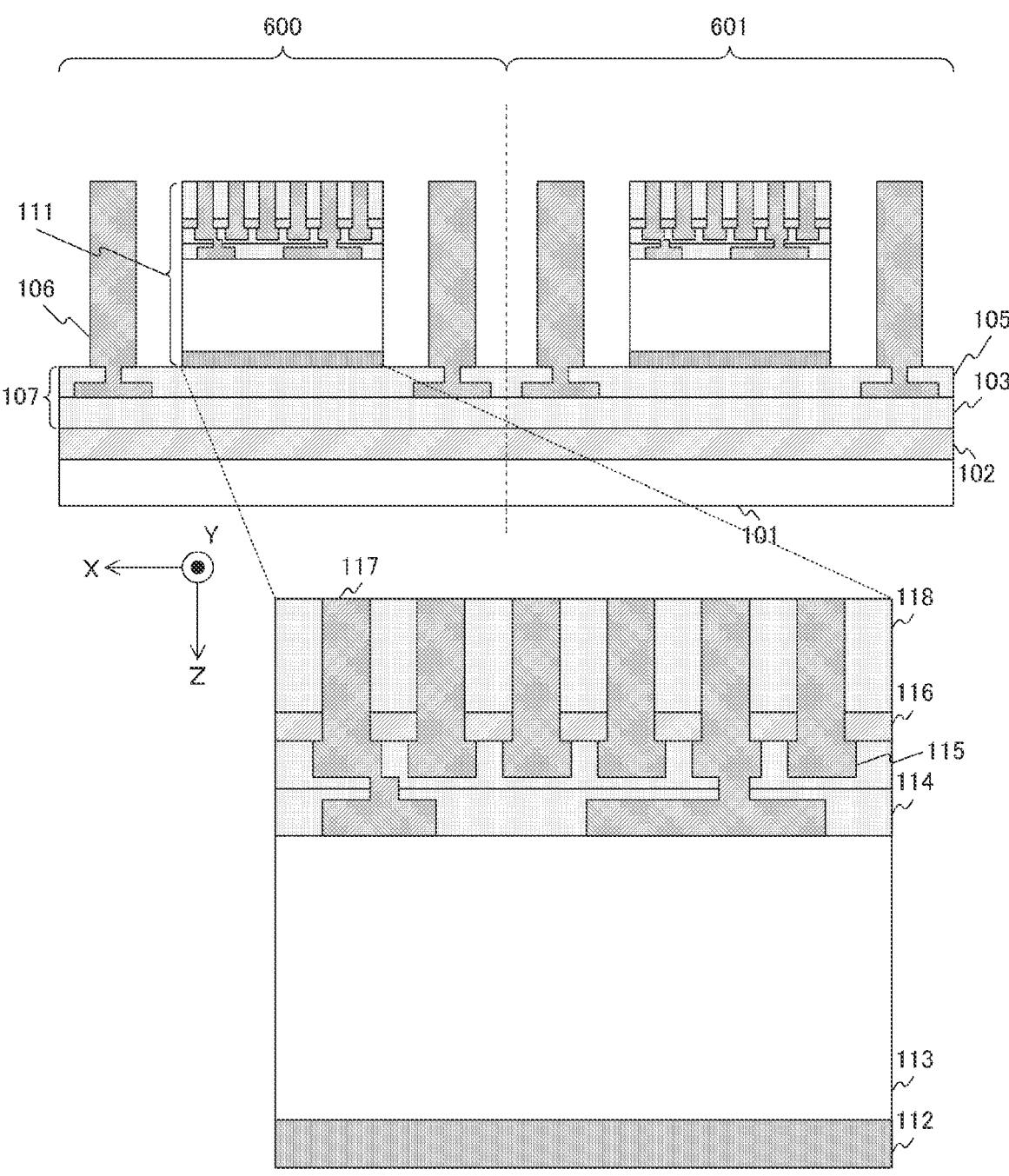
FIG. 7 is a diagram for describing a process of adhering an integrated circuit die according to the first embodiment of the present technology.

In FIG. 7, the integrated circuit die 111 is adhered to the dielectric layer 105 by an adhesive 112. As depicted in the drawing, the integrated circuit die 111 is secured to each of the package regions 600 and 601. In other embodiments, more integrated circuit dies 111 may be secured to each region.

The integrated circuit die 111 is a logic die, a memory die, a power management integrated circuit die, a radio frequency (RF) die, a sensor die, a micro electro mechanical systems (MEMS) die, a signal processing die, a front end die, or the like, or a combination thereof. As the logic die, for example, a microcontroller is used as a central processing unit. As the memory die, a dynamic random access memory (DRAM) die, a static RAM (SRAM) die, or the like is used. As the signal processing die, a digital signal processing (DSP) die or the like is used. As the front end die, for example, an analog front end (AFE) die is used.

In addition, in a case where a plurality of integrated circuit dies or dummy dies is secured, the integrated circuit dies or dummy dies may be of different sizes (for example, different heights and/or surface areas). In other embodiments, the integrated circuit dies 111 may have the same size (for example, the same height and/or surface area).

Furthermore, a dummy die for the purpose of preventing warpage and relaxing stress may be secured. In a case where a plurality of integrated circuit dies or dummy dies is secured, the height of each die may be different. In particular, in a case where the dummy dies are secured, a thickness is preferably thinner than a thickness of the integrated circuit die 111 in order to reduce an influence of stress on the wiring such as the frontside rewiring layer described later.

Prior to being secured to the dielectric layer 105, the integrated circuit die 111 has been processed in accordance with applicable manufacturing processing to form an integrated circuit in the integrated circuit die 111. For example, the integrated circuit dies 111 each include a semiconductor substrate 113 including silicon. Note that the semiconductor substrate 113 may include another semiconductor material such as germanium, a compound semiconductor, an alloy semiconductor, or a combination thereof. The compound semiconductor includes, for example, silicon carbide, gallium arsenide, gallium phosphide, indium phosphide, indium arsenide, and/or indium antimonide. The alloy semiconductor includes silicon germanium (SiGe), gallium arsenide phosphorus (GaAsP), indium aluminum arsenide (AlInAs), aluminum gallium arsenide (AlGaAs), and the like. In addition, the alloy semiconductor may include lanthanum gallium arsenide (GaLnAs), indium gallium nitride (GaInP), indium gallium arsenide phosphide (GaInAsP), or the like. Devices such as transistors, diodes, capacitors, resistors, and the like may be formed in or on the semiconductor substrate 113, for example, may be interconnected by an interconnect structure 114 formed by a wiring pattern of one or more dielectric layers on the semiconductor substrate 113 to form an integrated circuit.

In the integrated circuit die 111, a pad 115 such as an aluminum pad to which external connection is performed is further configured. The pad 115 is on an active side on which a circuit is formed in the integrated circuit die 111. A passivation film 116 is formed on the integrated circuit die 111 and a part of the pad 115. An opening penetrates the pad 115 from the passivation film 116. A die connector 117, such as conductive pillar (including a metal such as copper, for example), is in the opening with the passivation film 116 interposed therebetween and is mechanically and electrically coupled to each pad 115. The die connector 117 may be formed by, for example, plating or the like. The die connector 117 electrically couples each integrated circuit of the integrated circuit die 111.

Note that, in the integrated circuit die 111, a single layer or a plurality of rewiring layers may be formed on the pad 115 and the passivation film 116. The formation processing is similar to the formation processing of the above backside rewiring layer. In that case, the die connector 117 is connected to the wiring of an uppermost layer of the rewiring layer. By forming such a rewiring layer, it is possible to alleviate a gap between a wiring pitch of the integrated circuit die 111 and a wiring pitch of the die connector 117.

In addition, at this time, the conductive material configuring the wiring pattern may have a first portion in contact with the seed layer and a second portion in non-contact with the seed layer. With this configuration, since the seed layer is not formed immediately below the second portion of the conductive material, the wiring pattern can be deformed or moved following stress from outside, and the stress can be effectively relaxed. In addition, in a case where terminals such as a die connector and a via described later in the present embodiment are formed on the wiring pattern, stress applied to a root of the terminals can be reduced. Note that a gap width A between the first portion and the second portion is preferably, for example, 50 nanometers (nm) or more and 1000 nanometers (nm) or less.

In FIG. 7 again, a dielectric material 118 is formed on the active side of the integrated circuit die 111. In addition, the dielectric material 118 is formed to seal the die connector 117. The dielectric material 118 may be a polymer such as PBO, polyimide, or BCB, a nitride such as silicon nitride, an oxide such as silicon oxide, PSG, BSG, BPSG, or BPSG, or a combination thereof. For example, the dielectric layer 118 may be formed by spin coating, lamination, CVD, or the like.

The adhesive 112 is on a backside of the integrated circuit die 111 and adheres the integrated circuit die 111 to the backside rewiring layer 107 including the dielectric layer 105 and the like shown in the drawing. As the adhesive 112, any suitable adhesive, epoxy resin, die attach film (DAF), or the like can be used. The adhesive 112 may be applied to the backside of the integrated circuit die 111, for example, a backside of each semiconductor wafer, or may be applied onto a surface of the carrier substrate 101. The integrated circuit die 111 is singulated, for example, by sawing, dicing, or the like, and adhered to the dielectric layer 105 with the adhesive 112 by using, for example, a pick-and-place tool.

Figure 8:
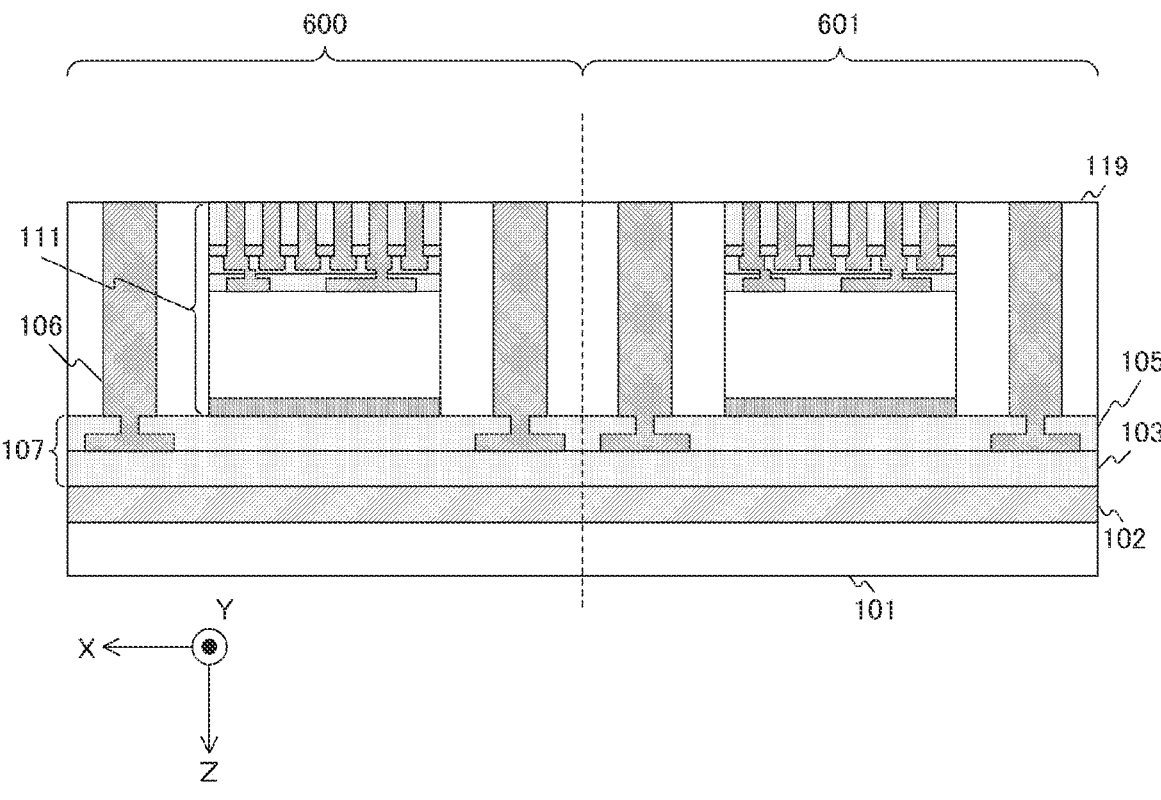
FIG. 8 is a diagram for describing a process of applying an encapsulant according to the first embodiment of the present technology.

In FIG. 8, the encapsulant 119 is a molding compound (for example, epoxy resin), and is applied by a method such as compression molding or transfer molding. After being cured with heat or light, the encapsulant 119 is ground to expose the through via 106 and the die connector 117. Upper surfaces of the through via 106, the die connector 117, and the encapsulant 119 have a flattened shape after the grinding processing.

Subsequently, the formation processing of the frontside rewiring layer 120 will be described with reference to FIGS. 9 to 12. As shown in FIG. 12, the frontside rewiring layer 120 includes dielectric layers 121, 122, 123, and 124 and wiring patterns 125, 126, and 127.

Figure 9:
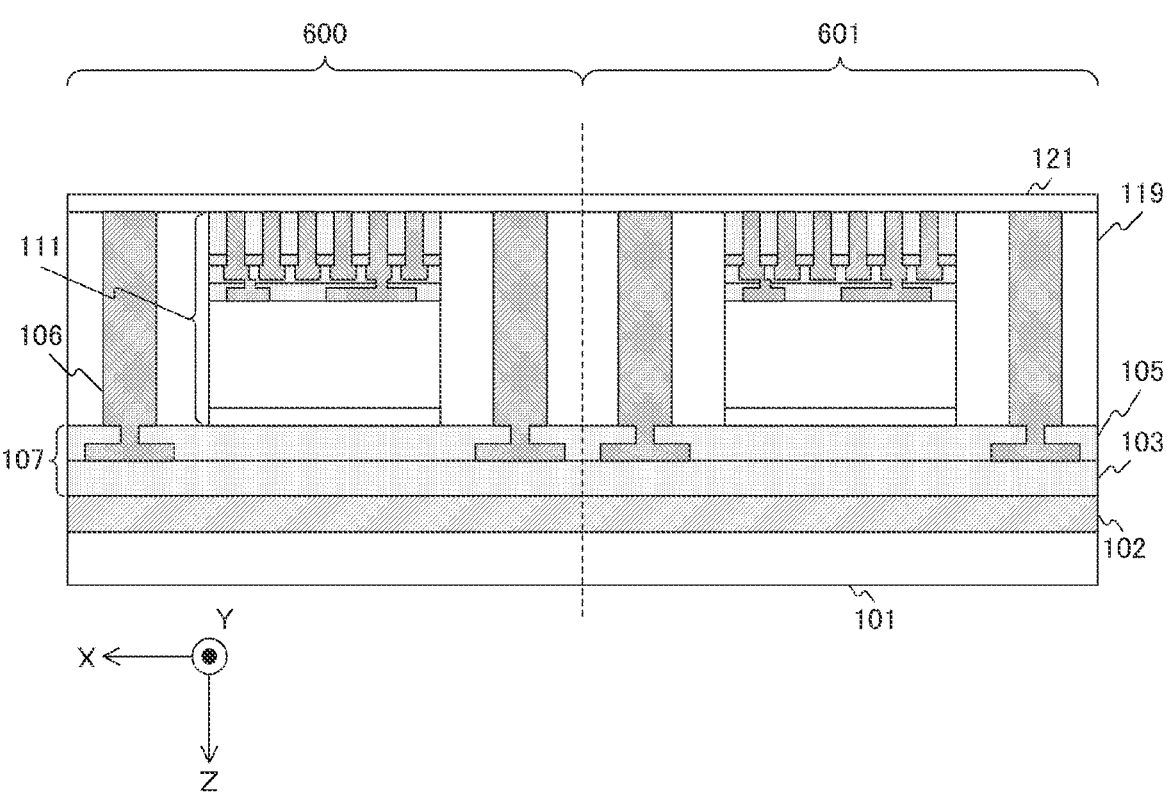
FIG. 9 is a diagram for describing a process of depositing a dielectric layer according to the first embodiment of the present technology.

In FIG. 9, the dielectric layer 121 is deposited on the encapsulant 119, the through via 106, and the die connector 117. For example, the dielectric layer 121 is formed with a polymer including a photosensitive material such as PBO, polyimide, or BCB, and is patterned by using a lithography mask. Note that the dielectric layer 121 may be formed with a nitride such as silicon nitride, an oxide such as silicon oxide, PSG, BSG, BPSG, or BPSG, or the like. The dielectric layer 121 may be formed by spin coating, lamination, CVD, or the like, or a combination thereof.

Figure 10:
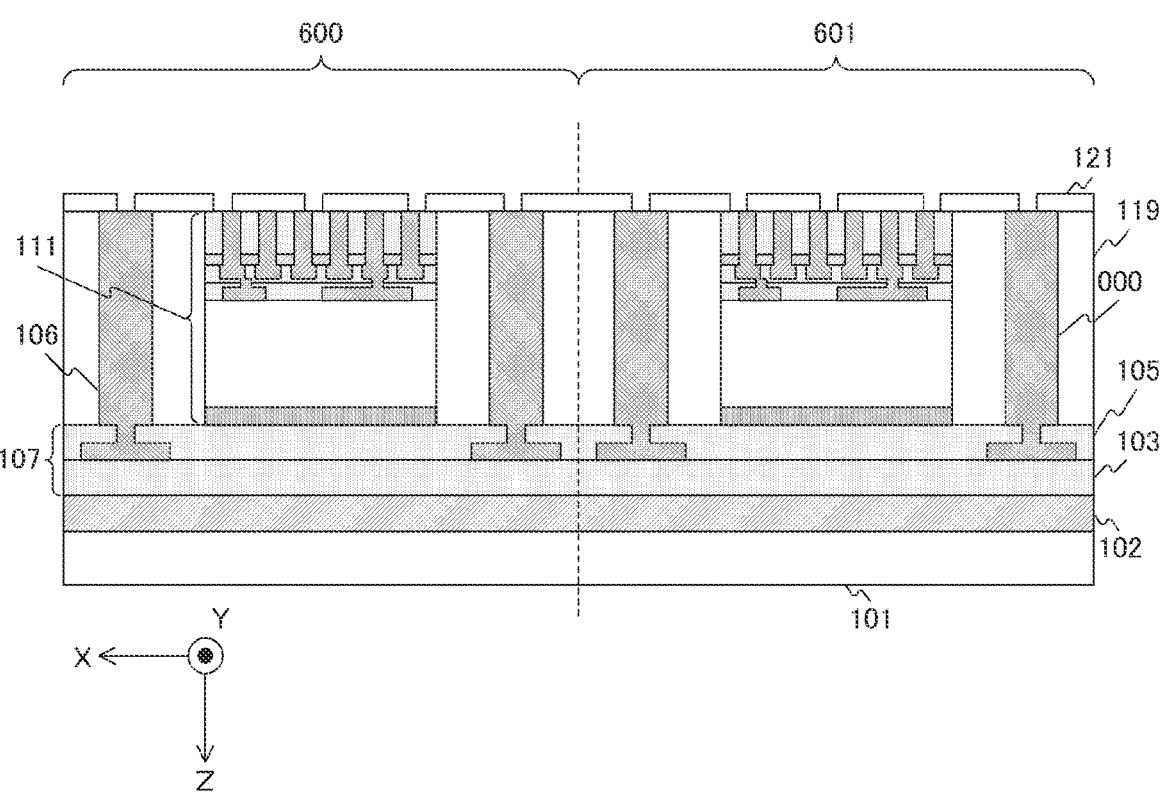
FIG. 10 is a diagram for describing a process of patterning according to the first embodiment of the present technology.

Thereafter, as depicted in FIG. 10, the dielectric layer 121 is patterned to form an opening to expose a part of the through via 106 and the die connector 117. The patterning is performed by exposing the dielectric layer 121 in a case where the dielectric layer 121 is a photosensitive material. Alternatively, the patterning may be performed by acceptable processing, for example, by etching using anisotropic etching.

Figure 11:
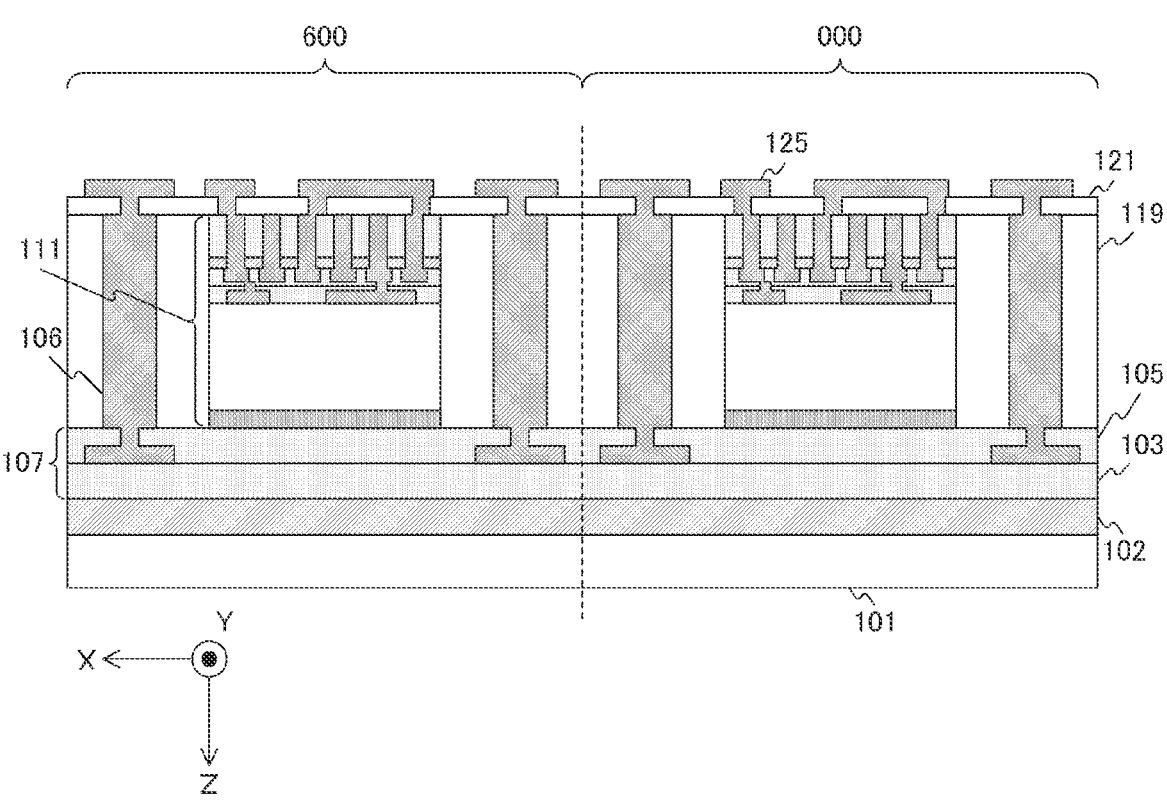
FIG. 11 is a diagram for describing a process of forming a wiring pattern according to the first embodiment of the present technology.
Figure 12:
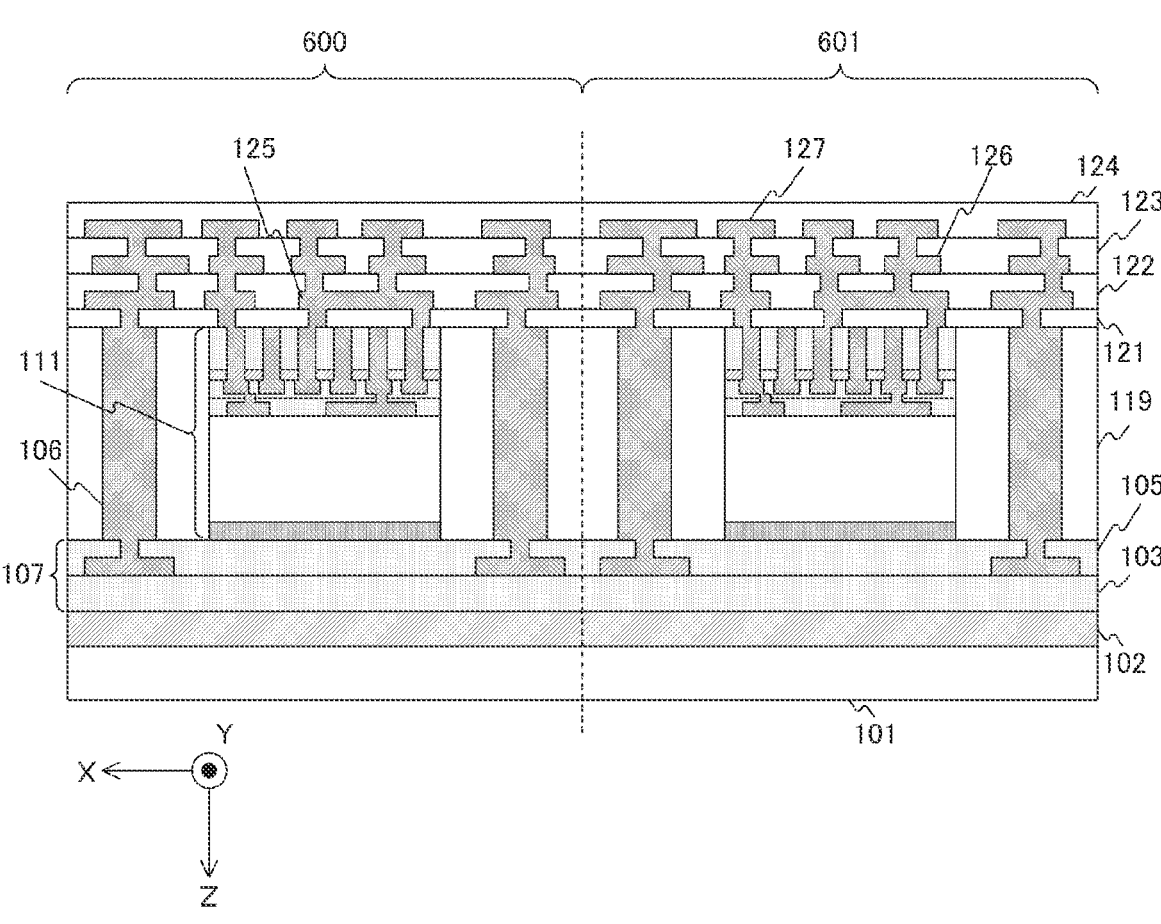
FIG. 12 is a diagram for describing a process of forming the frontside rewiring layer according to the first embodiment of the present technology.

In FIG. 11, the wiring pattern 125 having a via is formed on the dielectric layer 121. As an example of forming the wiring pattern 125, a seed layer (not shown) is formed on the dielectric layer 121 and in the opening of the dielectric layer 121. The seed layer is a metal layer, which may include a single layer or multiple layers including different materials. An example of the seed layer includes a titanium layer and a copper layer on the titanium layer. The seed layer may be formed by, for example, PVD or the like. An optimum thickness of the seed layer for forming the wiring pattern is from 50 nanometers (nm) to 200 nanometers (nm).

Thereafter, a photoresist is formed and patterned on the seed layer. The photoresist is formed by spin coating or the like. The pattern of the photoresist is formed corresponding to the wiring pattern 125. Patterning forms an opening in the photoresist to expose the seed layer. A conductive material is formed in the opening of the photoresist and the exposed portion of the seed layer. The conductive material is formed by plating such as electrolytic plating or electroless plating. The conductive material may include a metal such as copper, titanium, tungsten, or aluminum. Thereafter, the photoresist is removed by ashing treatment using oxygen plasma or the like. Thereafter, the exposed portion of the seed layer is then removed, for example, by using etching processing such as wet etching or dry etching. The seed layer and the remaining portion of the conductive material form the wiring pattern 125 and a via. The via is formed with the dielectric layer 121 interposed therebetween, for example, in the opening to the through via 106 and/or the die connectors 117.

By repeating similar processing hereinafter, the dielectric layers 121, 122, 123, and 124 and the wiring patterns 125, 126, and 127 are formed in the frontside rewiring layer 120 as depicted in FIG. 12.

An example of a film thickness of the dielectric layers 121, 122, 123, and 124 is 1 micrometer (um) to 10 micrometers (um), but is desirably 5 micrometers (um) or less from the viewpoint of height reduction. An example of a film thickness of the wiring patterns 125, 126, and 127 is 0.5 micrometers (um) to 4 micrometers (um), and is also desirably 2 um or less from the viewpoint of height reduction.

A wiring pattern (for example, wiring pattern 125) of a lower layer of the frontside rewiring layer 120 can be patterned, and after being coated with the dielectric layer 122, can be flattened by, for example, chemical mechanical polishing (CMP) or the like. In this case, the dielectric layer 122 is formed to be divided into a lower layer formed before flattening and an upper layer formed after flattening with an upper surface of the wiring pattern 125 as a boundary. Such formation improves flatness of the entire chip. In addition, the wiring pattern 125 may be formed to be thicker than the wiring patterns 126 and 127. For example, the wiring pattern 125 may be 3 micrometers (um), and the wiring patterns 126 and 127 may be 2 micrometers (um). As a result, for example, no recess is formed on an upper surface of the via of the wiring pattern 125, and the flatness is further improved.

In addition, an example of a wiring pitch of the wiring patterns 125, 126, and 127 is 1 micrometer (um) to 10 micrometers (um), but is desirably 5 micrometers (um) or less from the viewpoint of miniaturization.

Next, FIGS. 13 to 17 each depict a sectional view of an intermediate step during further processing after FIG. 12.

Figure 13:
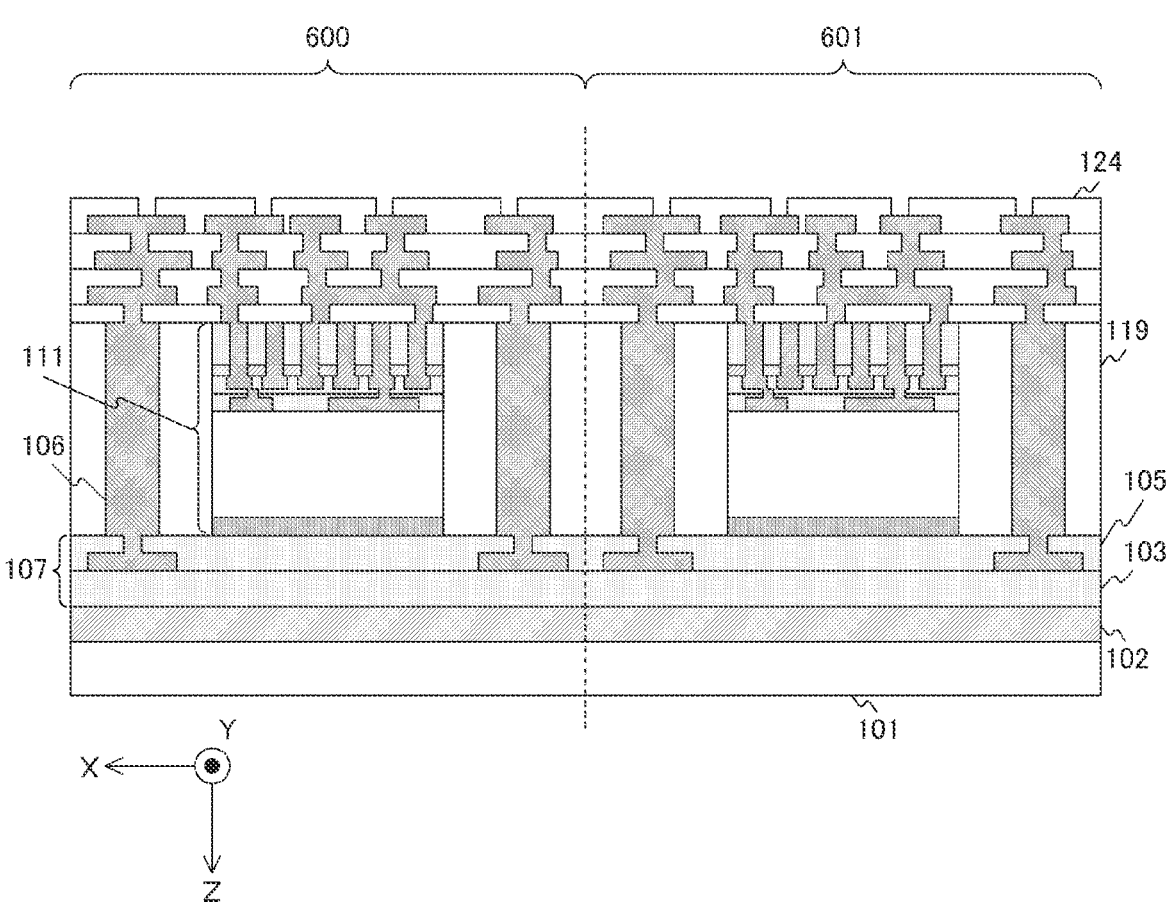
FIG. 13 is a diagram for describing a process of patterning according to the first embodiment of the present technology.

In FIG. 13, thereafter, the dielectric layer 124 is patterned. The patterning is performed by the above processing. Here, more or fewer dielectric layers and wiring patterns may be formed in the frontside rewiring layer 120.

Figure 14:
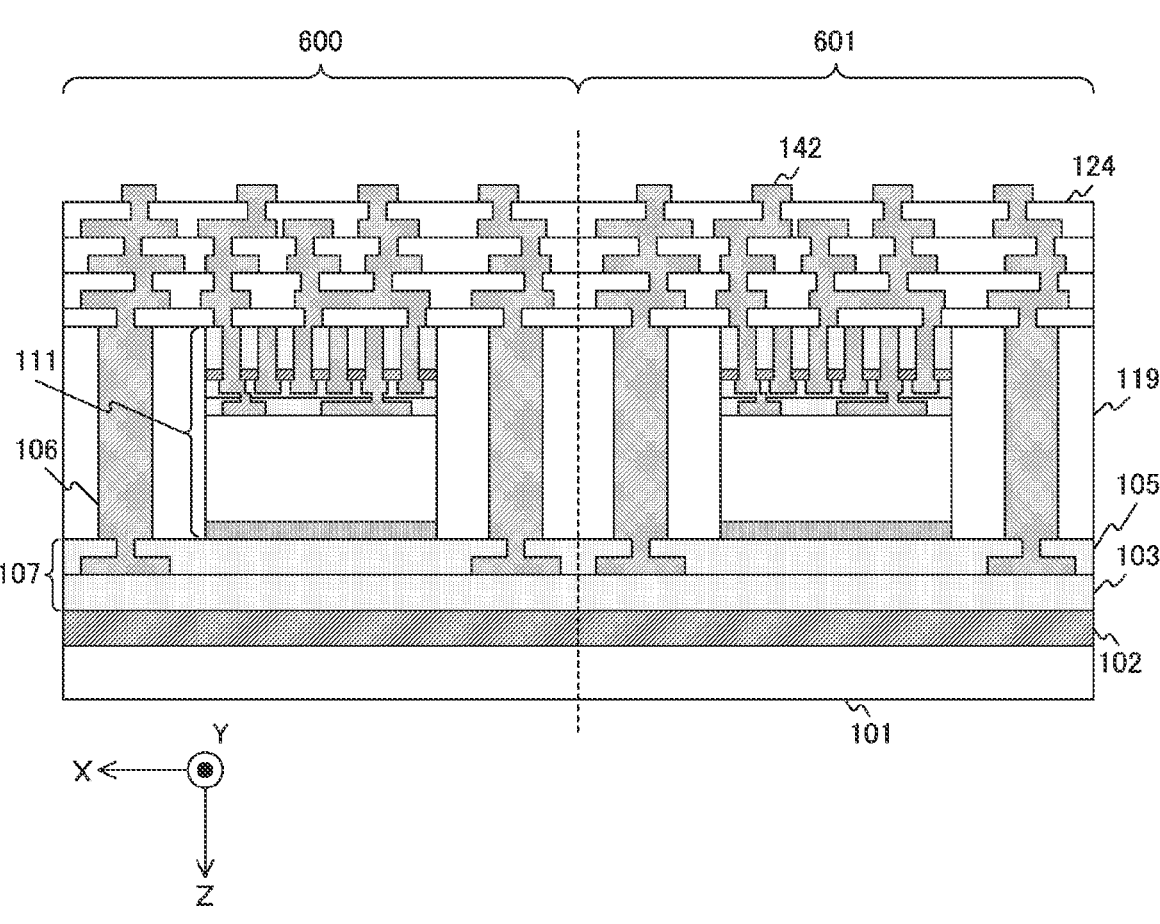
FIG. 14 is a diagram for describing a process of forming an under bump metal according to the first embodiment of the present technology.

In FIG. 14, an under bump metal (under barrier metal (UBM)) 142 is formed on an outer surface of the frontside rewiring layer 120. The under bump metal 142 is used to couple to the conductive connector 143. In the embodiment shown in the drawing, the under bump metal 142 is connected to the wiring pattern 127 via an opening formed in the dielectric layer 124.

Figure 15:
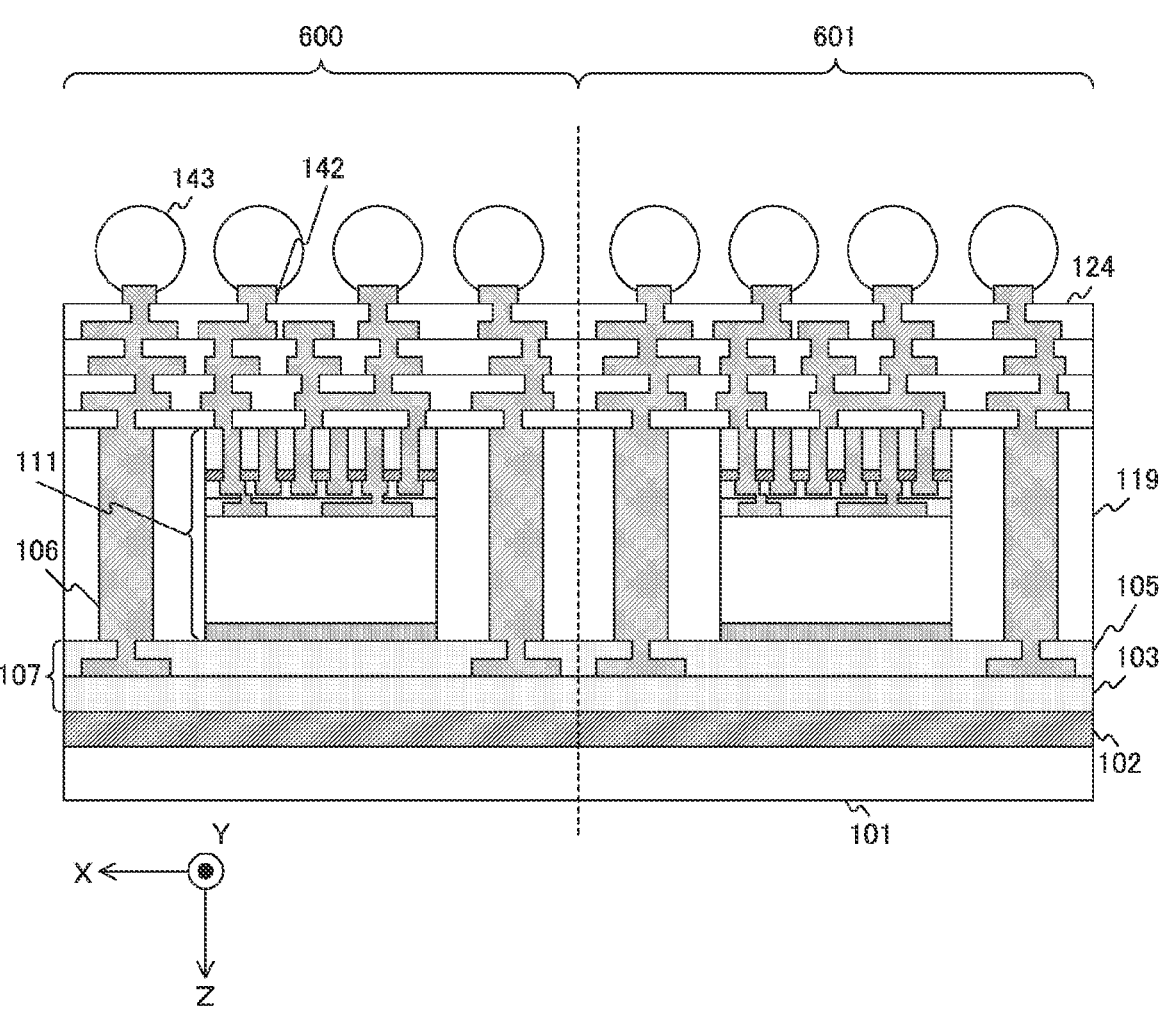
FIG. 15 is a diagram for describing a process of forming a conductive connector according to the first embodiment of the present technology.

In FIG. 15, the conductive connector 143 is formed on the under bump metal 142. The conductive connector 143 may be a ball grid array (BGA) connector, a solder ball, a metal column, a C4 bump, a microbump, a bump formed by an electroless nickel electroless palladium immersion gold (ENEPIG) method, or the like. The conductive connector 143 may include a conductive material, such as solder, copper, aluminum, gold, nickel, silver, palladium, tin, or a combination thereof. The conductive connector 143 is formed by first forming a layer of solder by commonly used method such as evaporation, electroplating, printing, solder transfer, ball placement, or the like. After the layer of solder is formed, reflow may be performed to form the layer of solder into a desired bump shape.

Figure 16:
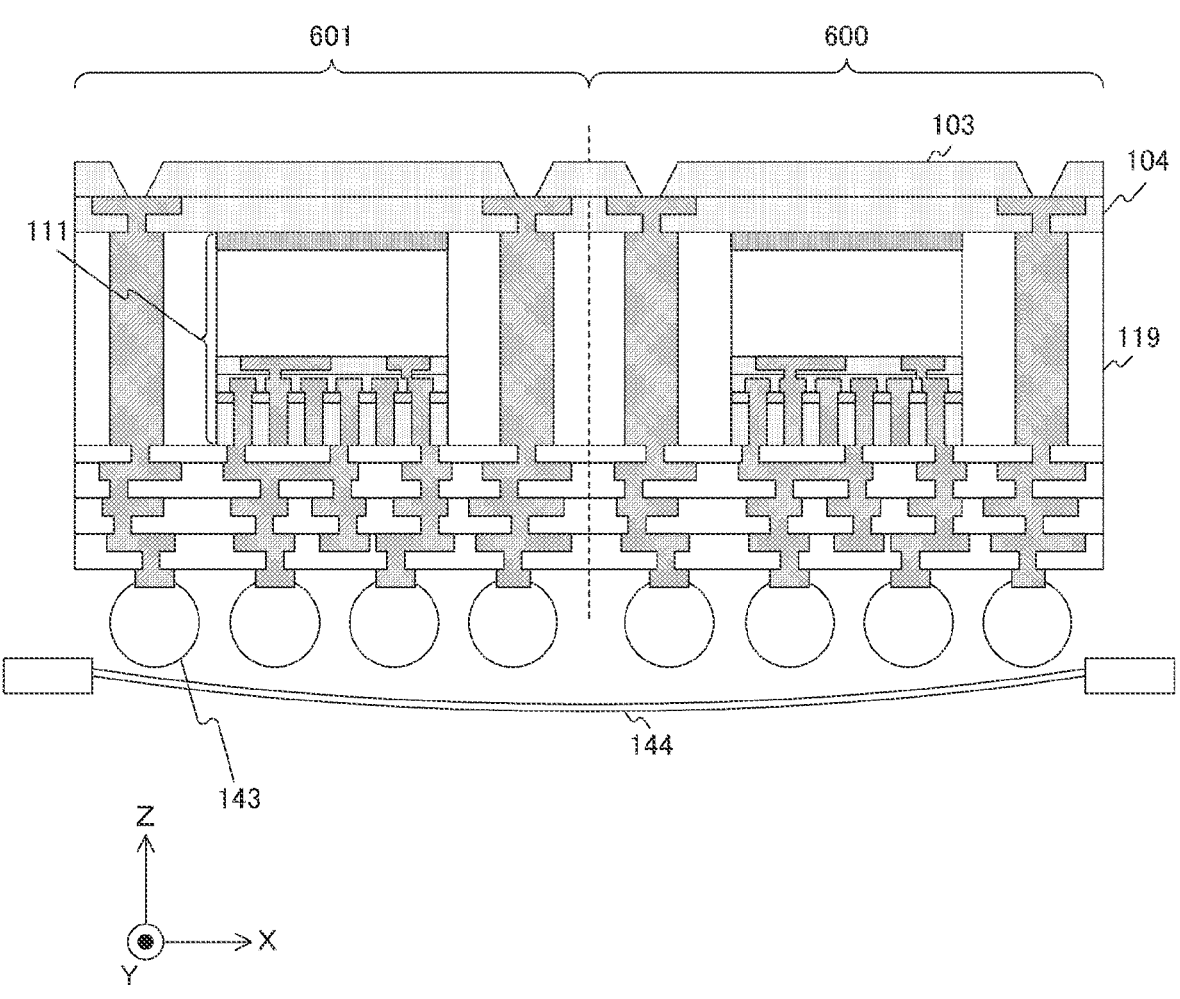
FIG. 16 is a diagram for describing a process of peeling the carrier substrate according to the first embodiment of the present technology.

In FIG. 16, the carrier substrate 101 is peeled off from the dielectric layer 103 of the backside rewiring layer 107. The carrier substrate 101 can be peeled off by irradiating the release layer 102 with light such as laser light or UV light so that the release layer 102 can be decomposed under heat of light and the carrier substrate 101 can be removed. Then, the structure body is turned over and placed on a tape 144.

As further shown in the drawing, an opening that exposes a part of the wiring pattern 104 is formed in the dielectric layer 103. The opening is formed by using, for example, laser drilling, etching, or the like.

Figure 17:
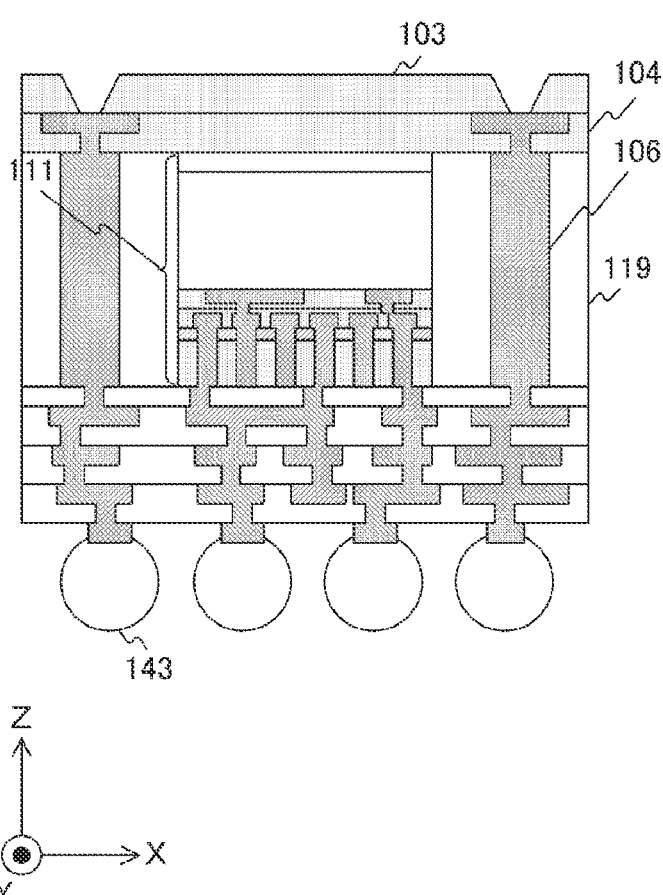
FIG. 17 is a diagram for describing a process of singulation according to the first embodiment of the present technology.

In FIG. 17, a singulation process is executed by dicing between the adjacent package regions 600 and 601 along a scribe line region.

As described above, in the first embodiment of the present technology, the signal line is wired in which the angle formed when the signal line crosses the boundary line is less than a predetermined angle in at least one of the two regions divided by the boundary line. It is therefore possible to prevent disconnection due to stress near the boundary line. The reliability of the semiconductor device 500 can be improved by preventing the disconnection.

2. Second Embodiment

In the first embodiment described above, the signal line 126-1 and the like including the segment whose angle with the boundary line is less than the predetermined angle are wired. Meanwhile, it is also conceivable that stress concentrates on an external terminal near the boundary line in the dielectric layers 103 and 105. The semiconductor device 500 according to a second embodiment is different from the semiconductor device 500 according to the first embodiment in that stress on the external terminal is relaxed.

Figure 18:
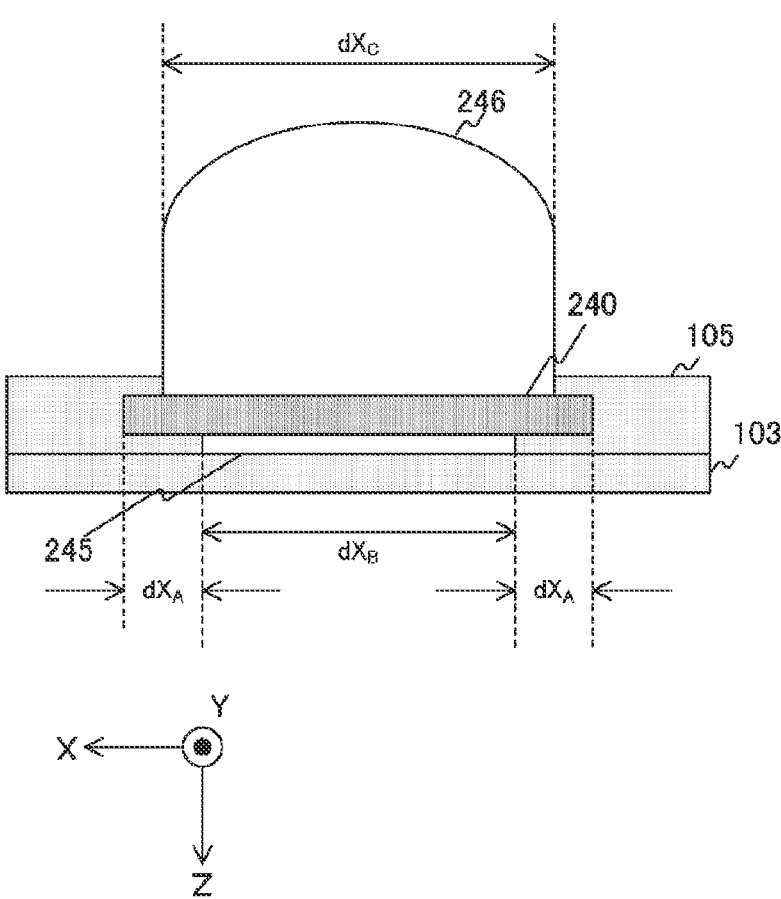
FIG. 18 is an example of a sectional view of a dielectric layer according to a second embodiment of the present technology.

FIG. 18 is an example of a sectional view of the dielectric layers 103 and 105 according to the second embodiment of the present technology. The drawing is a sectional view when viewed from the Y direction after an unnecessary region of a seed layer 245 is removed and the dielectric layer 105 is further formed on the wiring pattern 104 and the dielectric layer 103.

An external terminal 246 is formed in the dielectric layer 105. A conductive material 240 is formed under the external terminal 246. One of both surfaces of the conductive material 240 is connected to the external terminal 246. In addition, the other of both surfaces of the conductive material 240 has a first portion in contact with the seed layer 245 and a second portion in non-contact with the seed layer 245. In the drawing, a portion having a width $dX_A$ of a lower surface of the conductive material 240 corresponds to the first portion, and portions having a width $dX_B$ on both sides of the conductive material 240 correspond to the second portion.

The first portion overlaps the seed layer 245, and the second portion does not overlap the seed layer 245. Such a shape is formed by over etching the seed layer 245 more than the region of the conductive material 240 when the seed layer 245 is removed by etching processing using the conductive material 240 as a mask. In the case of wet etching, the shape is formed by controlling an etching amount by, for example, time such that an etchant enters inside of the region of the conductive material 240.

With this configuration, since the seed layer 245 is not formed immediately below the second portion of the conductive material 240, the conductive material 240 can be deformed or moved following stress from outside, and the stress can be effectively relaxed. In addition, in a case where the external terminal 246 (an example of a solder ball in the drawing) or a via (not shown) such as a through via, a conductive pillar, or a solder ball is formed on the conductive material 240, stress applied to a root of the external terminal 246 or the via can be reduced.

In a case where the conductive material 240 includes copper (Cu) having a film thickness of about 5 micrometers (μm), the width $dX_A$ of the second portion is preferably 50 nanometers (nm) or more and 1000 nanometers (nm) or less.

In addition, the width $dX_B$ of the first portion and a width $dX_C$ of the exposed portion (that is, the opening of the dielectric layer 105) of the conductive material 240 may have a relationship represented in the following formula.

$$dX_B < dX_C \qquad \text{Formula 1}$$

Thus, the seed layer 245 is disposed inside a contact portion between the conductive material 240 and the external terminal 246 or the via. As a result, the degree of freedom of the conductive material 240 and the external terminal 246 or the via with respect to the stress applied to the exposed portion of the conductive material 240 (stress applied to the root of the external terminal 246 or the via) is further improved, and the stress can be effectively relaxed.

In addition, in the drawing, the width of the upper surface of the conductive material 240 and the width $dX_C$ of the exposed portion (opening of the dielectric layer 105) of the conductive material 240 may substantially coincide with each other with a deviation of 0 to several tens of nanometers (nm). That is, the external terminal 246 such as a solder ball, a via (not shown), and the like may be connected to the conductive material 240 over the entire upper surface of the conductive material 240. As a result, the degree of freedom of the external terminal 246 or the via by the second portion can be improved, and the effect of stress relaxation can be enhanced.

In addition, in the drawing, the second portion may be depletion (an air layer) or may be filled with the dielectric layer 105. In a case where the dielectric layer 105 is softer than the seed layer 245, the above configuration can improve the degree of freedom of the conductive material 240 and relax the stress.

Figure 19:
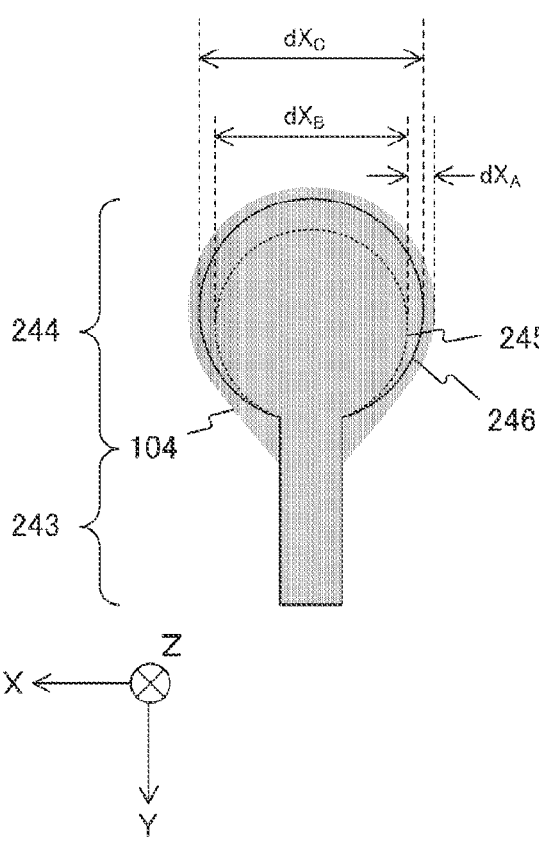
FIG. 19 is an example of a plan view of a dielectric layer according to the second embodiment of the present technology.

FIG. 19 is a plan view of the conductive material 240 when viewed from the direction of the Z axis. As depicted in the drawing, the conductive material 240 has a linear line 243 and a circular or elliptical land 244. The second portion may be disposed on an entire periphery of the first portion except for a connection portion between the line 243 and the land 244. In that case, the second portion may be disposed with a substantially constant width over the entire periphery of the first portion (except for the vicinity of the connection portion between the line 243 and the land 244).

In a case where the land 244 is formed on the dielectric layer 103 with the seed layer 245 interposed therebetween, the second portion of the land 244 is disposed with a space from the dielectric layer 103. In addition, as described with reference to FIG. 18, this space may be depletion (an air layer), or may be filled with the dielectric layer 105. By adopting such a configuration, the degree of freedom of the conductive material 240 and the external terminal 246 or the via is further improved, and the stress can be effectively relaxed.

Note that the first embodiment can be applied to the second embodiment.

As described above, in the second embodiment of the present technology, since the conductive material 240 has the portion in contact with the seed layer 245 and the portion in non-contact with the seed layer 245, it is possible to relax the stress generated near the boundary line in the dielectric layer 103 and the like.

First Modification

In the second embodiment described above, the conductive material 240 is provided with the portion in contact with the seed layer 245 and the portion in non-contact with the seed layer 245, but the stress might not be relaxed even with this configuration. The semiconductor device 500 according to a first modification of the second embodiment is different from the semiconductor device 500 according to the second embodiment in that an end surface of the conductive material 240 is tapered.

Figure 20:
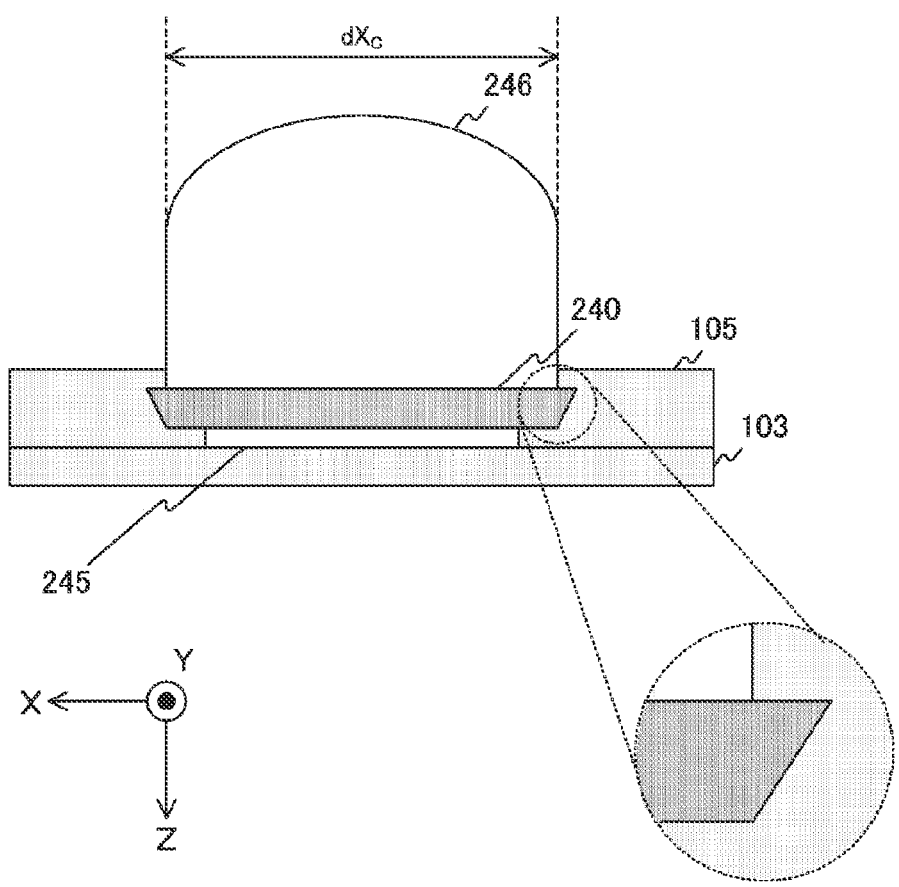
FIG. 20 is an example of a sectional view of a dielectric layer according to a first modification of the second embodiment of the present technology.

FIG. 20 is an example of a sectional view of the dielectric layers 103 and 105 according to the first modification of the second embodiment of the present technology. The upper surface of the conductive material 240 (in the drawing, a surface connected to the external terminal 246) according to the first modification of the second embodiment has a larger area than the lower surface. As a result, the end surface of the conductive material 240 is tapered.

What contributes to the degree of freedom of the conductive material 240 and the external terminal 246 or the via is a sum of a gap between the end surface of the upper surface and the end surface of the lower surface of the conductive material 240 and a distance from the end surface of the lower surface of the conductive material 240 to the end surface of the seed layer 245 (that is, the width $dX_A$). Therefore, in a case where a coverage of the seed layer 245 with the conductive material 240 is maintained on the one hand, and particularly a relationship of Formula 1 is satisfied on the other hand, the degree of freedom of the conductive material 240 and the external terminal 246 or the via can be improved. As a result, the stress can be effectively relaxed. Note that, a difference in a horizontal direction between the end surfaces of the upper surface and the lower surface of the conductive material 240 is desirably about 50 nanometers (nm) to 1000 nanometers (nm).

As described above, in the first modification of the second embodiment of the present technology, since the end surface of the conductive material 240 is tapered, stress can be relaxed more effectively.

Second Modification

In the second embodiment described above, the conductive material 240 has the line 243 and the land 244. However, in this configuration, stress might not be sufficiently relaxed. The semiconductor device 500 according to a second modification of the second embodiment is different from the semiconductor device 500 according to the second embodiment in that a plurality of lands 244 is provided.

Figure 21:
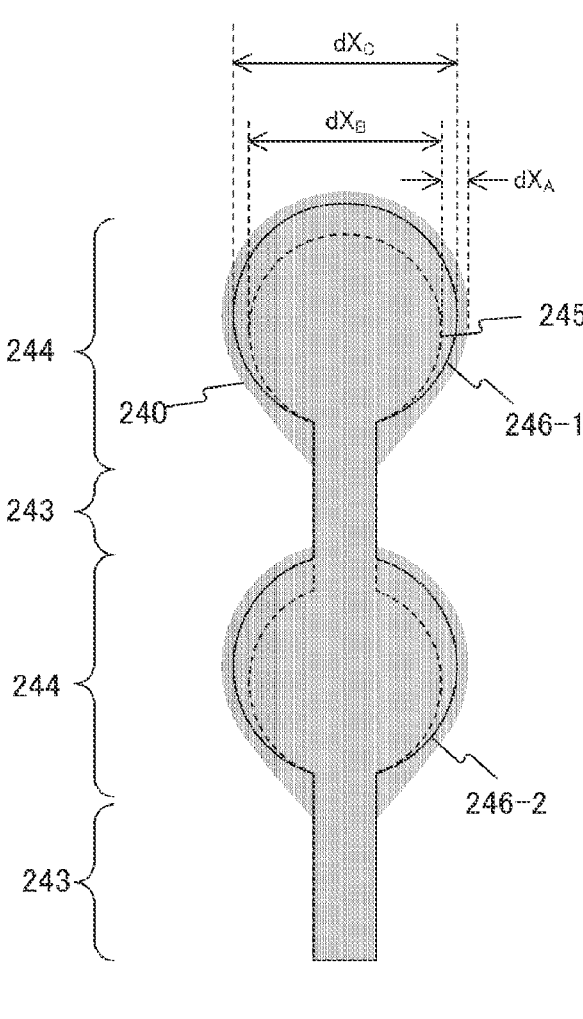
FIG. 21 is an example of a plan view of a dielectric layer according to a second modification of the second embodiment of the present technology.
Figure 21:
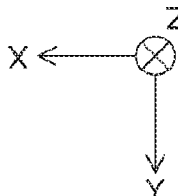

FIG. 21 is an example of a plan view of the dielectric layer 103 according to the second modification of the second embodiment of the present technology. In the dielectric layer 103, the conductive material 240 includes the plurality of lands 244. The line 243 is formed between the lands 244. This configuration can reduce a wiring resistance at the connection portion to a half. In addition, even in a case where disconnection occurs at a terminal (the external terminal 246 or the via) connected to either one, the function can be maintained. Furthermore, since the second portion is provided as described above, the degree of freedom of the conductive material 240 and the external terminal 246 or the via is further improved, and the stress can be more effectively relaxed.

Note that the first embodiment and the first modification of the second embodiment can also be applied to the second modification of the second embodiment.

As described above, in the second modification of the second embodiment of the present technology, since the conductive material 240 has the plurality of lands 244, the wiring resistance can be reduced, and the stress can be relaxed more effectively.

3. Third Embodiment

In the first embodiment described above, the signal line 126-1 and the like including the specific segment whose angle with the boundary line is less than the predetermined angle are wired. However, in this configuration, the stress might not be sufficiently relaxed. The semiconductor device 500 according to a third embodiment is different from the semiconductor device 500 according to the first embodiment in that a width of a segment intersecting the boundary line is increased.

Figure 22:
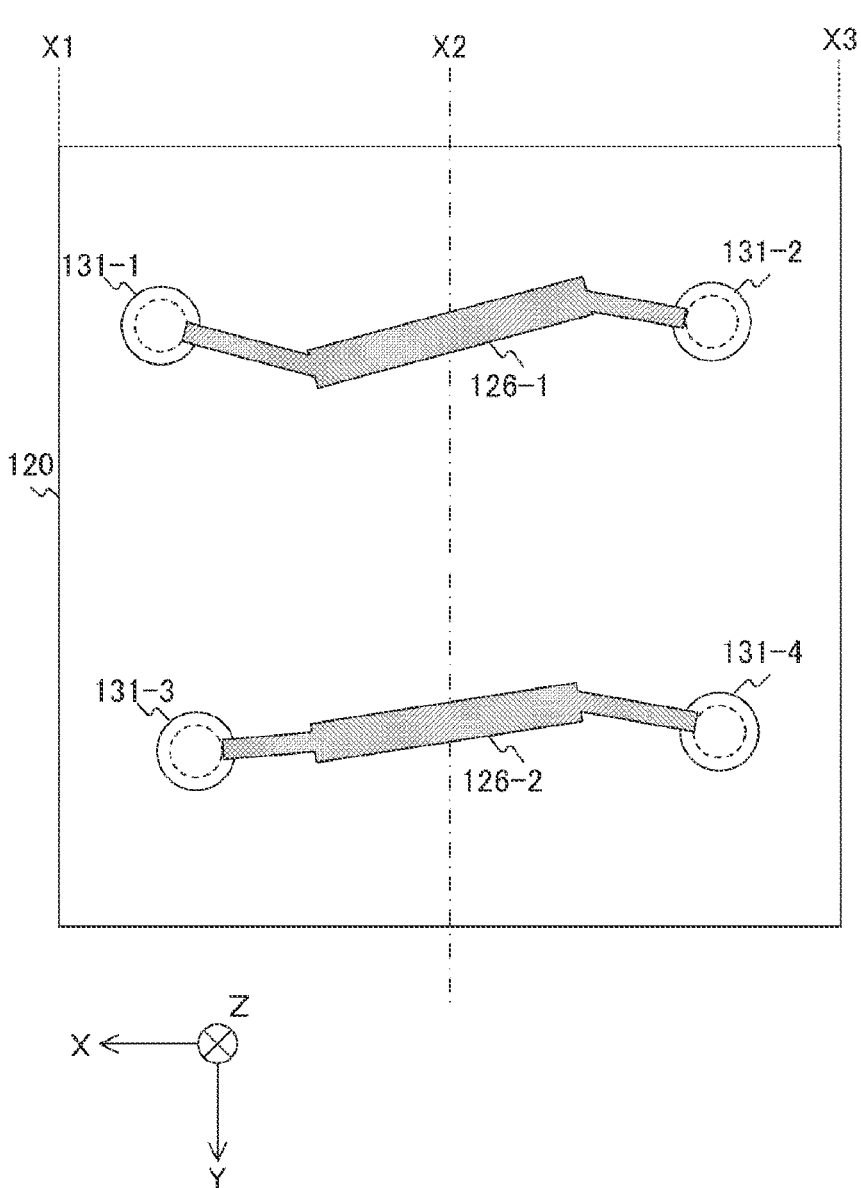
FIG. 22 is a plan view depicting an example of a wiring pattern according to a third embodiment of the present technology.

FIG. 22 is a plan view depicting an example of a wiring pattern according to the third embodiment of the present technology. In the third embodiment, the signal line 126-1 also connects the conductive via 131-1 and the conductive via 131-2 across the boundary line of the region where the integrated circuit die 111 is stacked. The signal line 126-2 connects the conductive via 131-3 and the conductive via 131-4 across the boundary line.

However, the wiring path of the signal line 126-1 includes a specific segment that intersects the boundary line and a segment that does not intersect the boundary line. The width of the segment that intersects with the boundary line is wider than the width of the segment that does not intersect the boundary line. This configuration similarly applies to the signal line 126-2.

It was observed that an incidence of disconnection due to stress was reduced by varying the width of the segments as illustrated in the drawing. For example, it has been observed that in a case where the width of the segment that intersects the boundary line is set to 2 W, which is twice a width W of the segment that does not intersect the boundary line, the disconnection rate can be reduced by 50% or more as compared with a case where the widths are the same.

Figure 23:
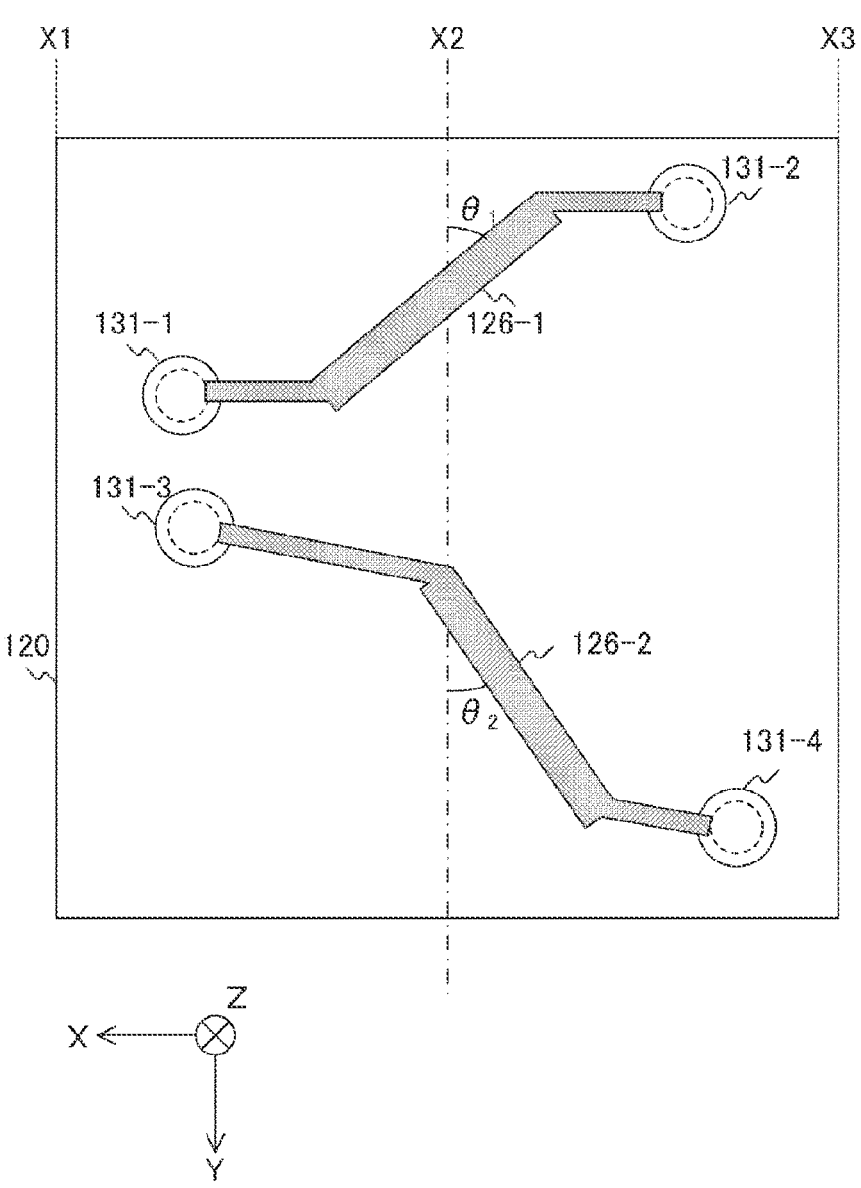
FIG. 23 is a plan view depicting another example of the wiring pattern according to the third embodiment of the present technology.

In addition, as illustrated in FIG. 23, similarly to the first embodiment, the width of the segment less than a predetermined angle can be wider with respect to the boundary line.

As described above, it is advantageous to increase a dimension of the wiring path in a width direction from the viewpoint of preventing disconnection. However, it is desirable that the dimension of the wiring path in the width direction is small from the viewpoint of wiring density. Therefore, a length of the segment having the width of 2 W (for example, 10 μm) is desirably as short as possible. For example, in a case where a distance from the upper surface of the semiconductor substrate 113 to the wiring path is L, when at least the segment of the wiring path extends 5×L (the actual measurement value in the present experimental example is 100 μm) around the boundary line, the occurrence of disconnection of the wiring path due to the stress can be suppressed.

Furthermore, the second embodiment and the first and second modifications of the second embodiment can also be applied to the third embodiment.

As described above, in the third embodiment of the present technology, since the width of the segment intersecting the boundary line is made wider than the width of the segment not intersecting the boundary line, it is possible to relax the stress generated near the boundary line.

4. Fourth Embodiment

In the first embodiment described above, the angle of one segment in the wiring path with the boundary line is set to be less than the predetermined angle, but in this configuration, stress might not be sufficiently relaxed. The semiconductor device 500 according to a fourth embodiment is different from the semiconductor device 500 according to the first embodiment in that an angle with a boundary line is less than a predetermined angle for all segments within a predetermined distance from the boundary line.

Figure 24:
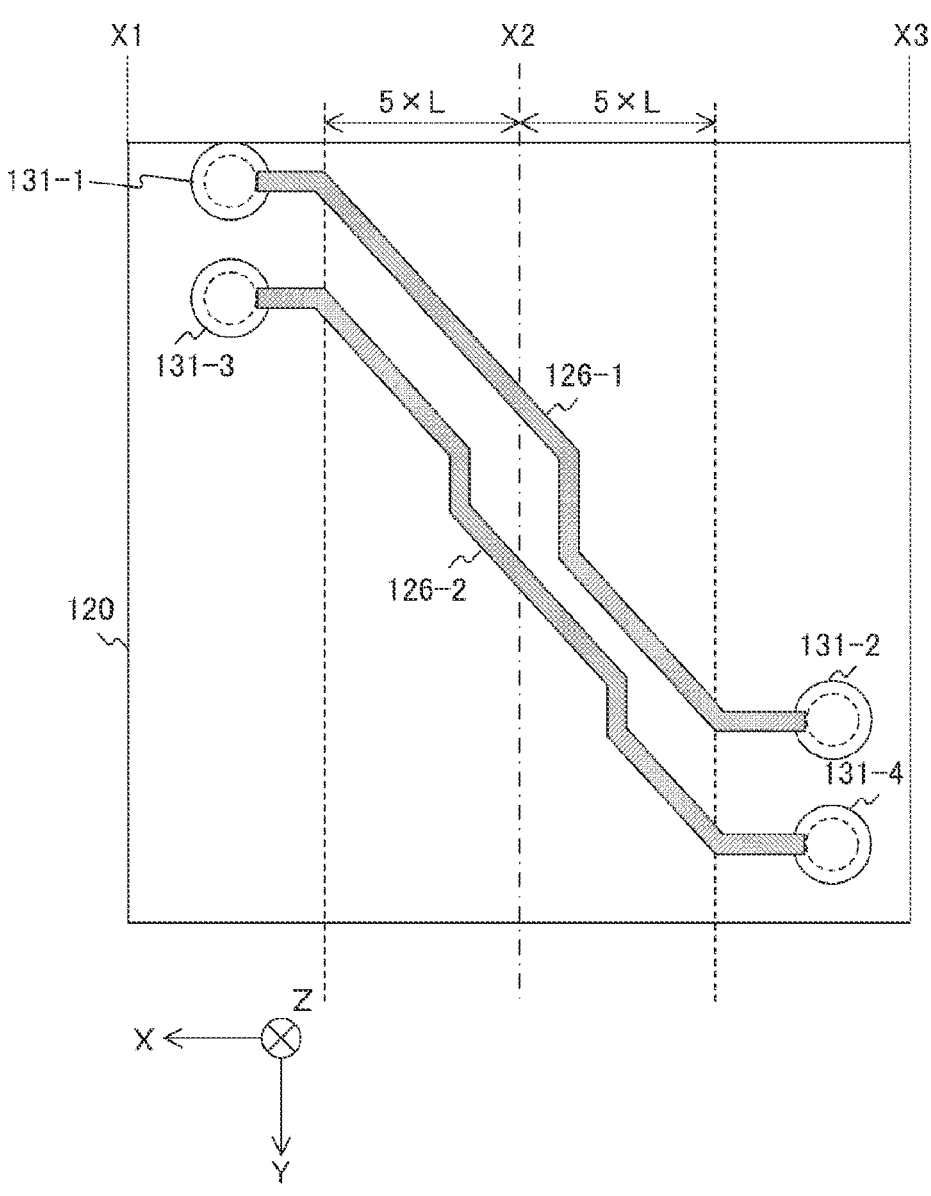
FIG. 24 is a plan view depicting an example of a wiring pattern according to a fourth embodiment of the present technology.

FIG. 24 is a plan view depicting an example of a wiring pattern according to the fourth embodiment of the present technology. In the fourth embodiment, the wiring path of each of the signal lines 126-1 and 126-2 is divided into five segments. In this embodiment, a distance from a lower surface of the integrated circuit die 111 to the wiring path is defined as L. Then, in the frontside rewiring layer 120, in a region of at least 5×L (100 um in this example) in a direction orthogonal to the boundary line with the boundary line as the center, all the segments of the wiring path are disposed such that the angle with respect to the boundary line is 50 degrees or less. In other words, the angle formed with the boundary line is less than a predetermined angle for all the segments in the region where the distance from the boundary line is within a predetermined distance (5×L or the like). As described above, since the stress at the boundary line is mainly generated in the direction perpendicular to the boundary surface (90 degree direction), by adopting such a configuration, the stress resistance in all the wiring paths near the boundary line can be improved.

In addition, the wiring path of each of the signal lines 126-1 and 126-2 has two segments extending along the boundary line (in a 0 degree direction). In this way, the distance of each segment having an angle other than 0 degrees with respect to the boundary line can be shortened, and a risk of disconnection can be further reduced.

Note that, in the drawing, a width of the signal lines is constant (for example, 5 μm), but the width of each segment having an angle other than 0 degrees with respect to the boundary line may be made larger (for example, doubled to 10 μm) than the width of the segment extending along the boundary line (in the 0 degree direction). This configuration can further reduce the risk of disconnection.

Note that the first to third embodiments and the modifications of the first to third embodiments can also be applied to the fourth embodiment.

As described above, in the fourth embodiment of the present technology, the angle formed with the boundary line is set to be less than the predetermined angle for all the segments in the region within the predetermined distance from the boundary line, and thus the stress resistance in the wiring path can be further improved.

5. Fifth Embodiment

In the first embodiment described above, the signal line 126-1 and the like including the segment whose angle with the boundary line is less than the predetermined angle are wired. However, in this configuration, there is a possibility that the reliability of the semiconductor device 500 is insufficient. The semiconductor device 500 according to the fifth embodiment is different from the semiconductor device 500 according to the first embodiment in that the reliability is improved by redundancy.

Figure 25:
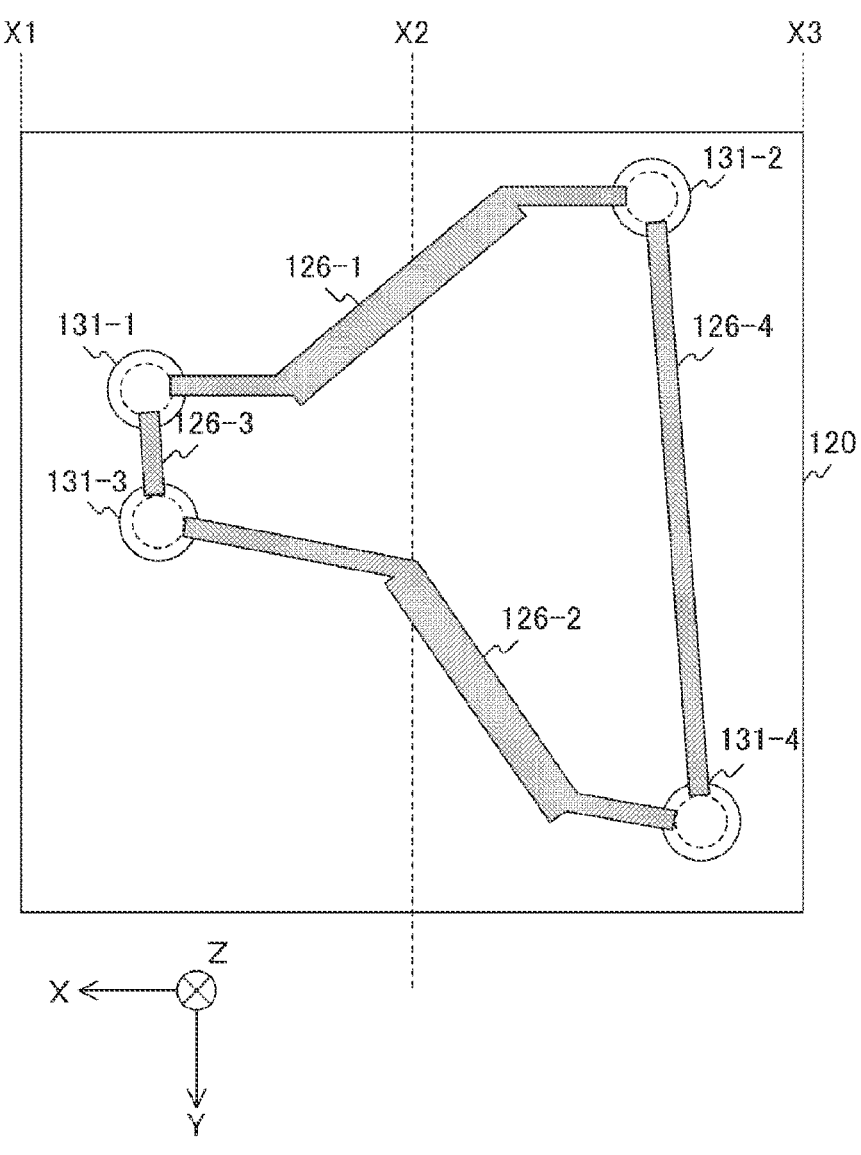
FIG. 25 is a plan view depicting an example of a wiring pattern according to a fifth embodiment of the present technology.

FIG. 25 is a plan view depicting an example of a wiring pattern according to the fifth embodiment of the present technology. In this fifth embodiment, the conductive vias 131-1 and 131-3 are electrically connected to each other by a signal line 126-3 that does not cross the boundary line between the integrated circuit die 111 and the encapsulant 119. In addition, the conductive vias 131-2 and 131-4 are electrically connected to each other by a signal line 126-4 that does not cross the boundary line.

For example, in a case where it is necessary to exchange signals between the conductive vias 131-1 and 131-2, a necessary wiring path is only the path of the signal line 126-1, and the path passing through the signal lines 126-2 to 126-3 is a redundant path. By wiring both the wiring path of the signal line 126-1 and the redundant path, even in a case where any of the paths is disconnected, an electronic device can function normally, and reliability is improved.

In addition, in this embodiment, in the wiring paths of the signal lines 126-1 and 126-2, angles of entry into boundary line between the integrated circuit die 111 and the encapsulant 119 are different from each other. This configuration can improve the stress resistance of the two paths as a whole even in a case where a stress having an angle other than 90 degrees with respect to the boundary line is generated.

Note that the first to fourth embodiments and the modifications of the first to fourth embodiments can also be applied to the fifth embodiment.

As described above, in the fifth embodiment of the present technology, since the signal lines are wired in both the wiring path and the redundant path of the signal line 126-1, the reliability can be improved.

Modification

In the fifth embodiment described above, the reliability is improved by redundancy, but in this configuration, there is a possibility that resistance to stress is insufficient. The semiconductor device 500 according to a modification of the fifth embodiment is different from the semiconductor device 500 according to the fifth embodiment in that the stress resistance is improved by providing a relay via.

Figure 26:
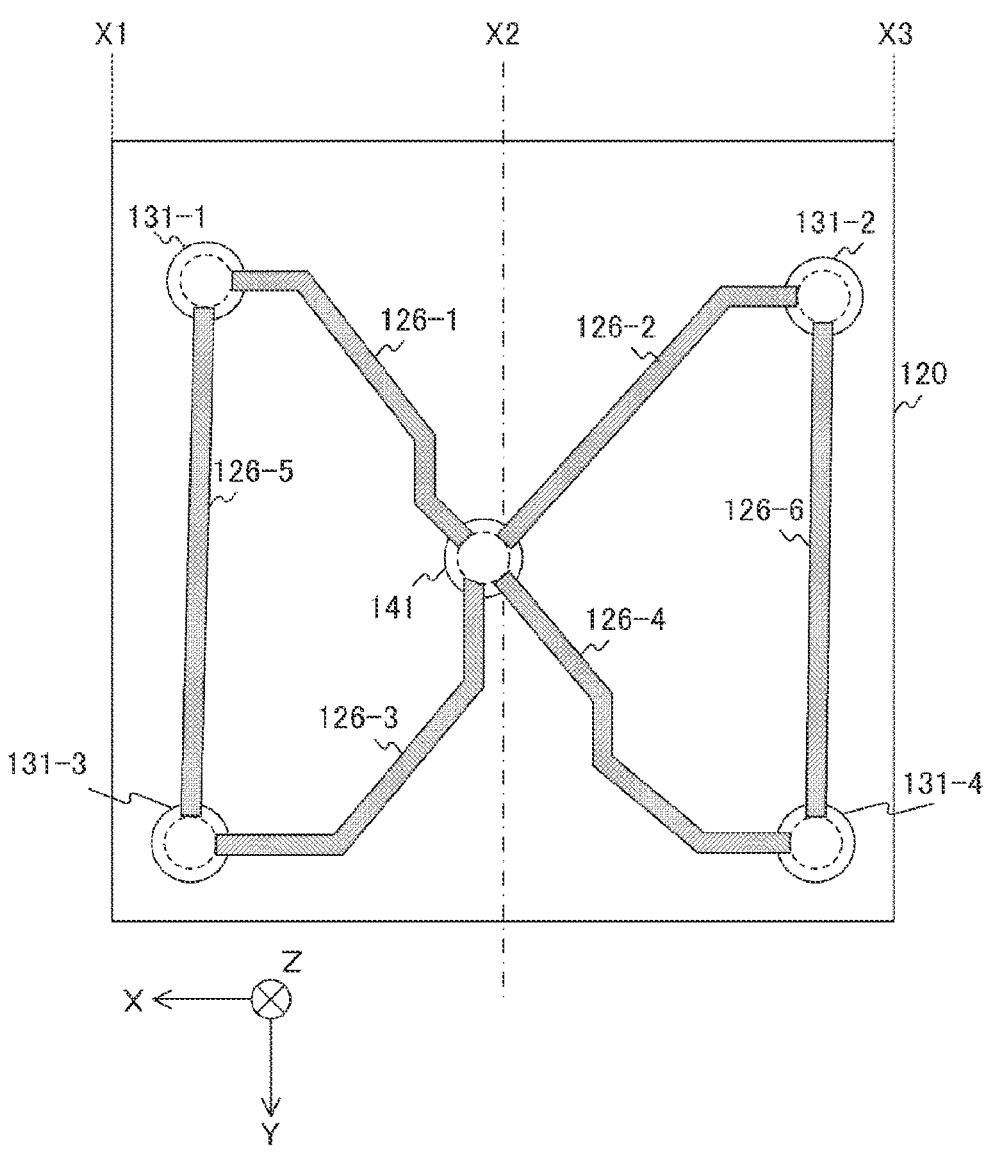
FIG. 26 is a plan view depicting an example of a wiring pattern according to a modification of the fifth embodiment of the present technology.

FIG. 26 is a plan view depicting an example of a wiring pattern according to the modification of the fifth embodiment of the present technology. In the frontside rewiring layer 120 according to the modification of the fifth embodiment, a relay via 141 is further disposed on the boundary lines.

In addition, the signal line 126-1 is wired between the conductive via 131-1 and the relay via 141, and the signal line 126-2 is wired between the conductive via 131-2 and the relay via 141. The signal line 126-3 is wired between the conductive via 131-3 and the relay via 141, and the signal line 126-4 is wired between the conductive via 131-4 and the relay via 141. A signal line 126-5 is wired between the conductive vias 131-1 and 131-3, and a signal line 126-6 is wired between the conductive vias 131-2 and 131-4. Each of the signal lines connected to the relay via 141 may be formed in a different layer.

For example, unlike the wiring paths of the signal lines 126-1 and 126-2, the paths of the signal lines 126-3 to 126-6 are redundant paths. Note that the signal lines 126-3 to 126-6 are examples of redundant signal lines.

The arrangement of the relay vias 141 on the boundary line can improve resistance to stress. In addition, as depicted in the drawing, by making the angles of entry into the boundary line different between the signal lines 126-1 and 126-2, the stress resistance can be improved even in a case where stress having an angle other than 90 degrees with respect to the boundary line is generated at the boundary line.

Figure 27:
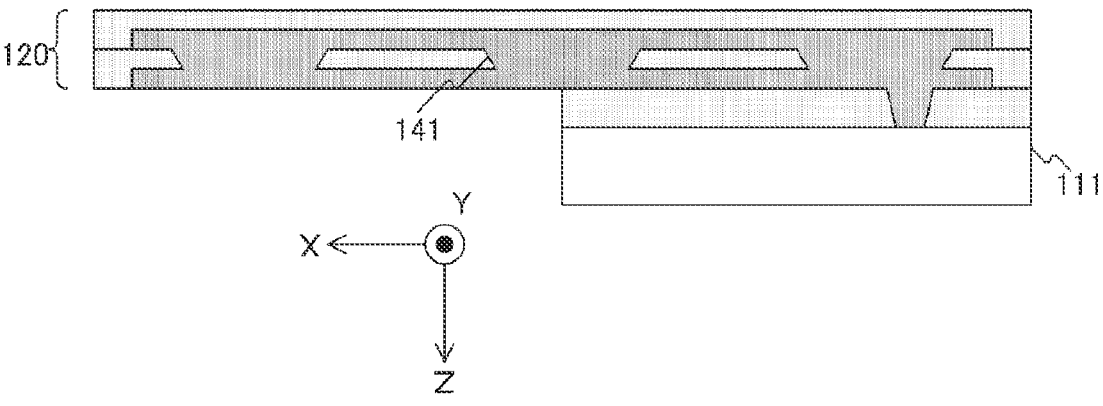
FIG. 27 is an example of a sectional view of a frontside rewiring layer according to the modification of the fifth embodiment of the present technology.

FIG. 27 is an example of a sectional view of the frontside rewiring layer 120 according to the modification of the fifth embodiment of the present technology. As illustrated in the drawing, the relay via 141 is disposed on the boundary line.

As described above, the wiring paths described with reference to FIGS. 3 and 22 to 26 are wiring paths constituting any of the wiring patterns 125, 126, and 127 respectively existing on the dielectric layers 121, 122, 123, and 124 constituting the frontside rewiring layer 120. Regarding the wiring paths, it is also effective to increase a density of the wiring patterns in a predetermined region near the boundary line, that is, the number of wiring paths extending beyond the predetermined region of the boundary line as a distance from the integrated circuit die 111 increases. The reason is because the stress from the integrated circuit die 111 decreases as the distance from the integrated circuit die 111 increases.

For example, in the frontside rewiring layer 120, the wiring pattern 125 is closest to the integrated circuit die 111, and the wiring pattern 127 is farthest. Therefore, for example, the density of the wiring pattern at the boundary line in the wiring pattern 127 is made larger than the density in the wiring pattern 125. In this way, wiring paths extending beyond more boundary lines can be configured to be separated from the integrated circuit die 111. In addition, since the number of wiring paths extending beyond the boundary line in the wiring pattern 125 is reduced, it is possible to increase a width of each wiring path and improve the stress resistance.

Furthermore, similarly, the arrangement of a wiring path depicted in any of FIGS. 3 and 22 to 26 described above can be adopted only for a wiring pattern having a relatively small distance from the integrated circuit die (in the frontside rewiring layer 120, for example, the wiring pattern 125). On the other hand, in a wiring pattern (in the frontside rewiring layer 120, for example, the wiring pattern 126 or 127) having a relatively large distance from the integrated circuit die, it is also possible to adopt a wiring path that is perpendicular to the boundary line and has the same width of each segment. As a result, a method of increasing the wiring efficiency is also useful from the viewpoint of achieving both wiring efficiency and the stress resistance.

Note that the first to fourth embodiments and the modifications of the first to fourth embodiments can also be applied to the modification of the fifth embodiment.

As described above, in the modification of the fifth embodiment of the present technology, since the relay via 141 is disposed on the boundary line, the stress resistance can be improved.

6. Sixth Embodiment

In the first embodiment described above, the signal line 126-1 and the like including the segment whose angle with the boundary line is less than the predetermined angle are wired. However, in this configuration, power supply stability and stress resistance might be insufficient. The semiconductor device 500 according to a sixth embodiment is different from the semiconductor device 500 according to the first embodiment in that a power supply and a ground are laid in a mesh shape or a solid shape.

Figure 28:
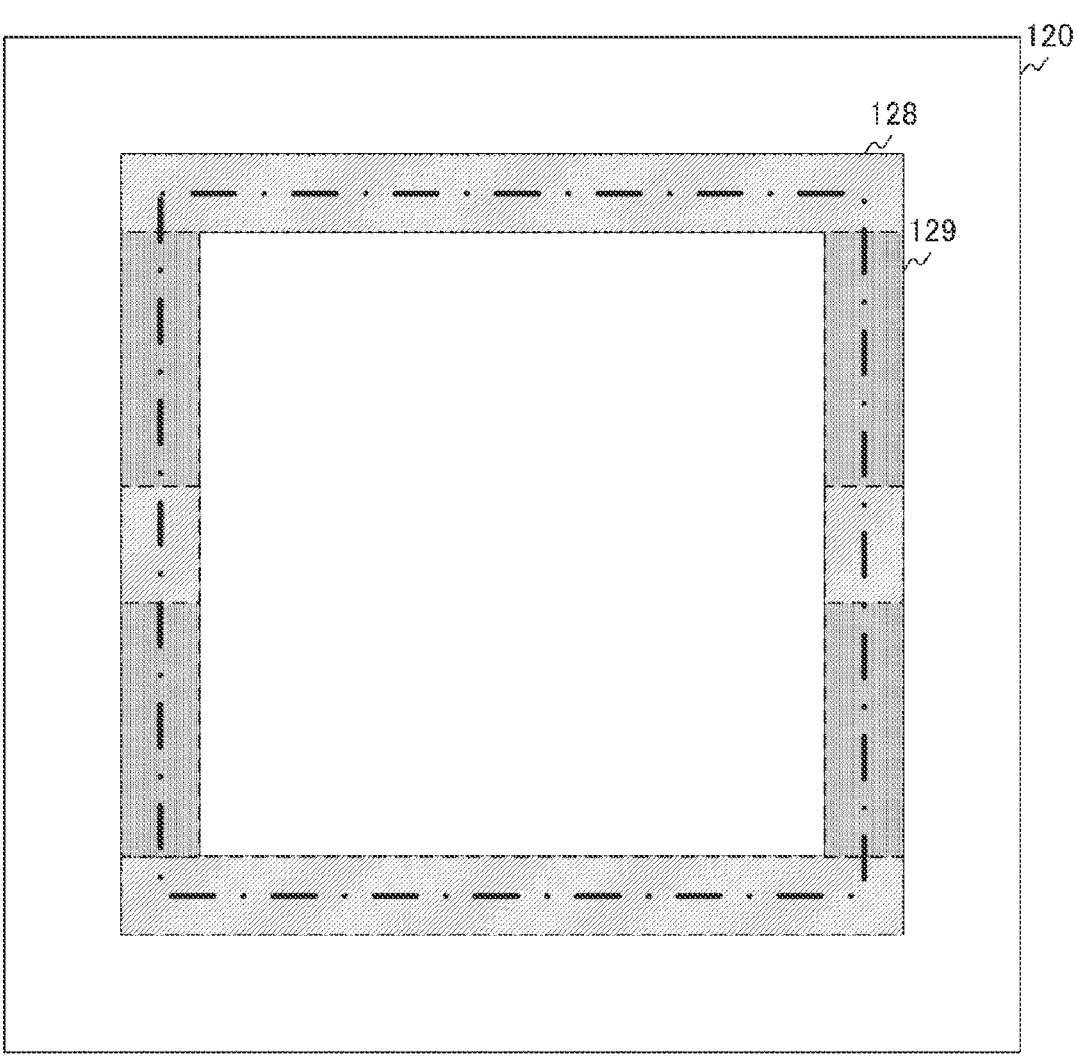
FIG. 28 is an example of a plan view of a frontside rewiring layer according to a sixth embodiment of the present technology.
Figure 28:
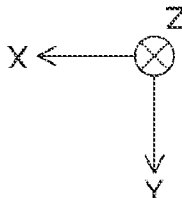

FIG. 28 is an example of a plan view of the frontside rewiring layer 120 according to a sixth embodiment of the present technology. An alternate long and short dash line in the drawing indicates a boundary line of a region where the integrated circuit die 111 is stacked. Near the boundary line, a power supply ground region 128 and a signal line region 129 are provided. In the drawing, the shaded region indicates the power supply ground region 128. A gray region indicates the signal line region 129. The shape of each of the power supply ground region 128 and the signal line region 129 is, for example, a rectangle (such as an oblong).

The power supply ground region 128 is a region to which at least one of a power supply or a ground to the integrated circuit die 111 is supplied. In the power supply ground region 128, for example, at least one of a power supply line or a ground line is wired in a mesh shape. Alternatively, the power supply and the ground are formed in a solid pattern in the power supply ground region 128. In this way, both power supply stability and stress resistance can be improved. In the signal line region 129, only the signal lines are wired by the wiring pattern illustrated in FIG. 3 and the like.

Figure 29:
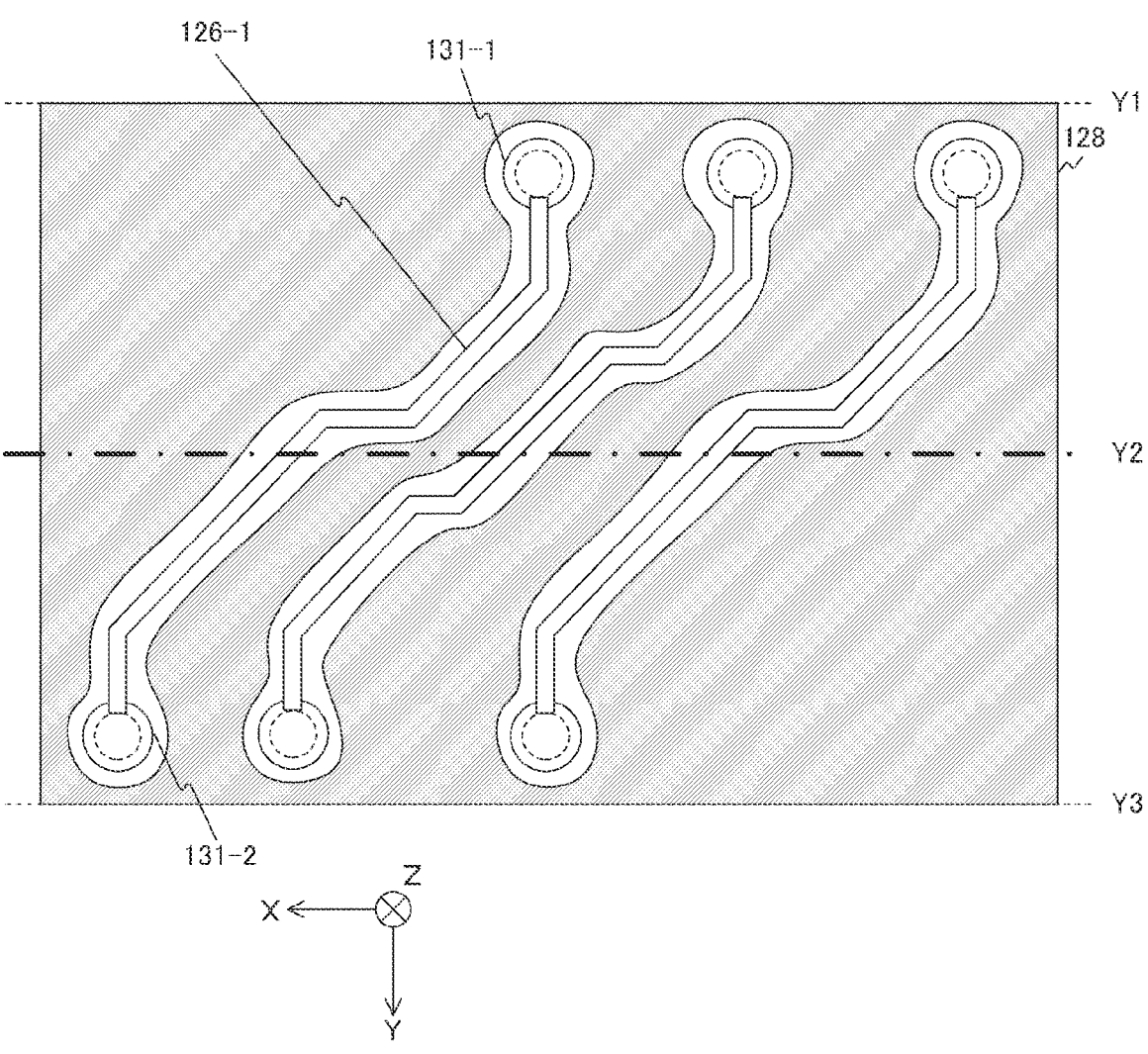
FIG. 29 is a diagram depicting a configuration example of a power supply ground region according to the sixth embodiment of the present technology.

FIG. 29 is a diagram depicting a configuration example of the power supply ground region 128 according to the sixth embodiment of the present technology. As illustrated in the drawing, signal lines such as the signal line 126-1 can be wired in the power supply ground region 128. A shaded region around the signal lines indicates a solid pattern of the power supply and the ground. With such a configuration, the power supply wiring having a solid or mesh shape serves as a shield, and stress resistance of signal wiring can be improved.

Note that although the frontside rewiring layer 120 has been described above as an example, a similar configuration can be adopted in the backside rewiring layer 107.

Furthermore, the first to fifth embodiments and the modifications of the first to fifth embodiments can also be applied to the sixth embodiment.

As described above, in the sixth embodiment of the present technology, since the power supply and the ground are provided in a mesh shape or a solid shape near the boundary line, the power supply stability and stress resistance can be improved.

Modification

In the sixth embodiment described above, the rectangular power supply ground region 128 and signal line region 129 are disposed. However, in a case where the signal line is wired obliquely with respect to the boundary line, a dead space in which the wiring path is not formed is generated, and there is a possibility that the wiring efficiency is lowered. The semiconductor device 500 according to a modification of the sixth embodiment is different from the semiconductor device 500 according to the sixth embodiment in that the wiring efficiency is improved.

Figure 30:
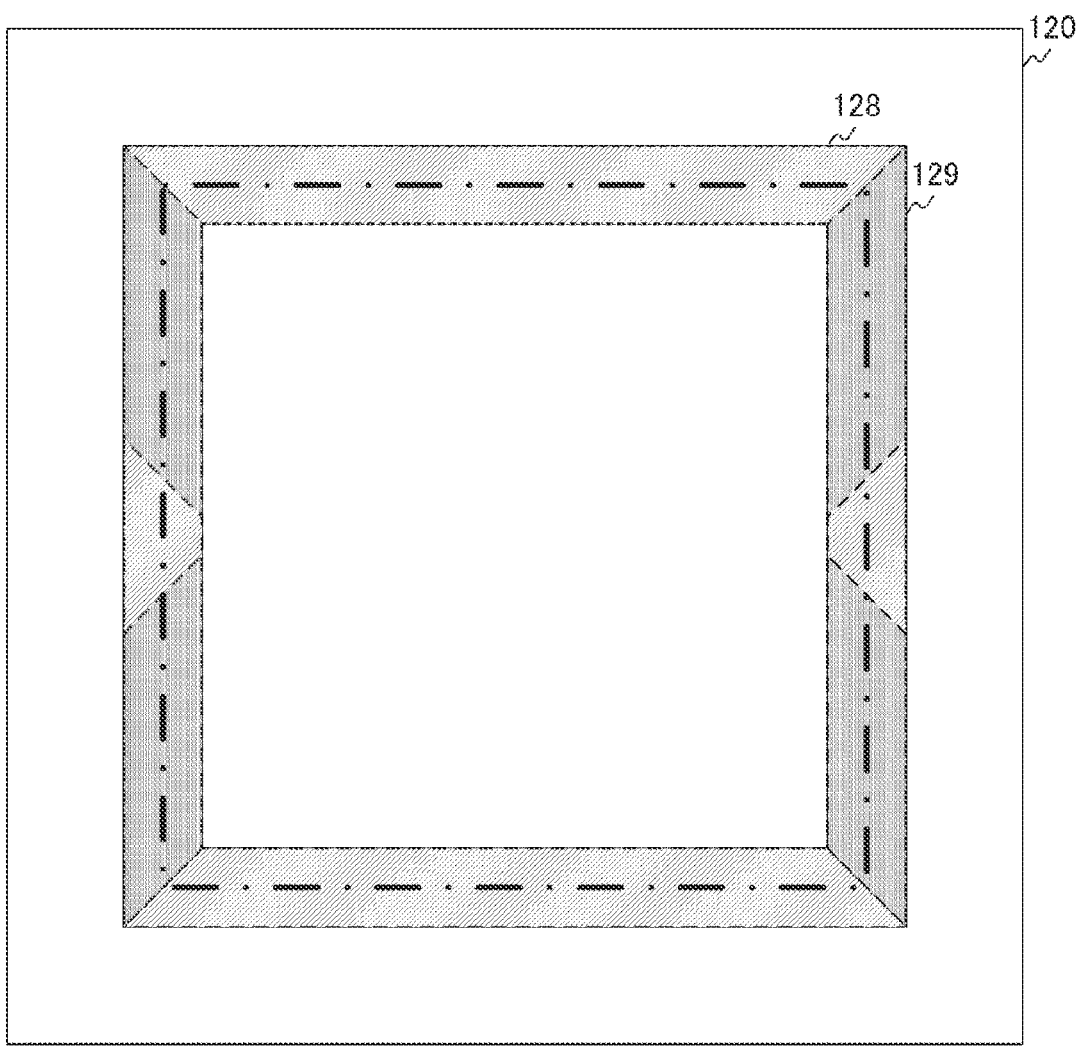
FIG. 30 is an example of a plan view of a frontside rewiring layer according to a modification of the sixth embodiment of the present technology.
Figure 30:
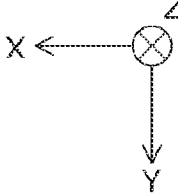

FIG. 30 is an example of a plan view of the frontside rewiring layer 120 according to the modification of the sixth embodiment of the present technology. In the frontside rewiring layer 120 according to the modification of the sixth embodiment, an angle formed by the boundary between the power supply ground region 128 and the signal line region 129 and the boundary line of the region where the integrated circuit die 111 is stacked is an angle different from 90 degrees (for example, 45 degrees). This configuration can reduce a dead space and improve the wiring efficiency.

Note that the first to fifth embodiments and the modifications of the first to fifth embodiments can also be applied to the modification of the sixth embodiment.

As described above, in the modification of the sixth embodiment of the present technology, the angle formed by the boundary between the power supply ground region 128 and the signal line region 129 and the boundary line of the region where the integrated circuit die 111 is stacked is an angle different from 90 degrees. Therefore, a dead space can be reduced and the wiring efficiency can be improved.

7. Seventh Embodiment

In the first embodiment described above, the wiring pattern illustrated in FIG. 3 is applied to a PoP structure in which the package 300 is stacked on the package 200. However, the wiring pattern of FIG. 3 can also be applied to a package other than the PoP structure such as a wafer level chip size package (WCSP). The semiconductor device 500 according to a seventh embodiment is different from the semiconductor device 500 according to the first embodiment in that a WCSP or the like is included.

Figure 31:
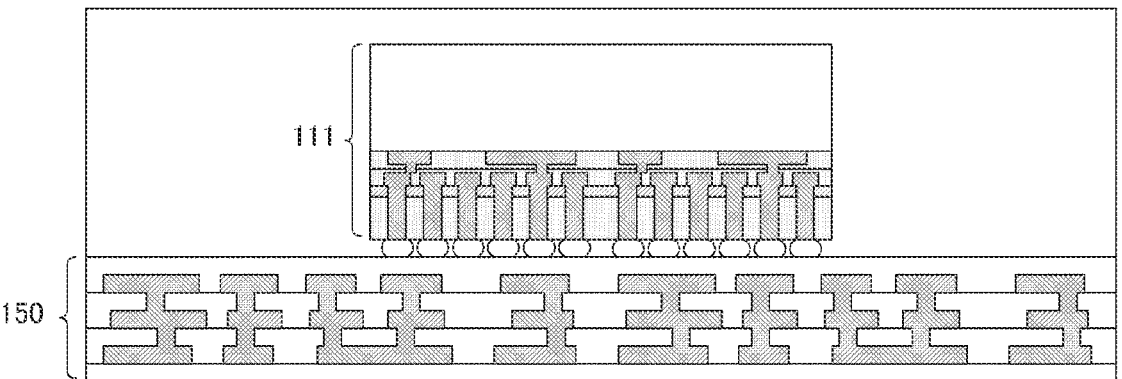
FIG. 31 is an example of a sectional view of a semiconductor device according to a seventh embodiment of the present technology.

FIG. 31 is an example of a sectional view of the semiconductor device 500 according to the seventh embodiment of the present technology. As illustrated in the drawing, the semiconductor device 500 includes a WCSP in which the wiring layer 150 is stacked on the integrated circuit die 111. The wiring pattern illustrated in FIG. 3 or the like can be applied to the WCSP. As a result, reliability of the WCSP can be improved.

Figure 32:
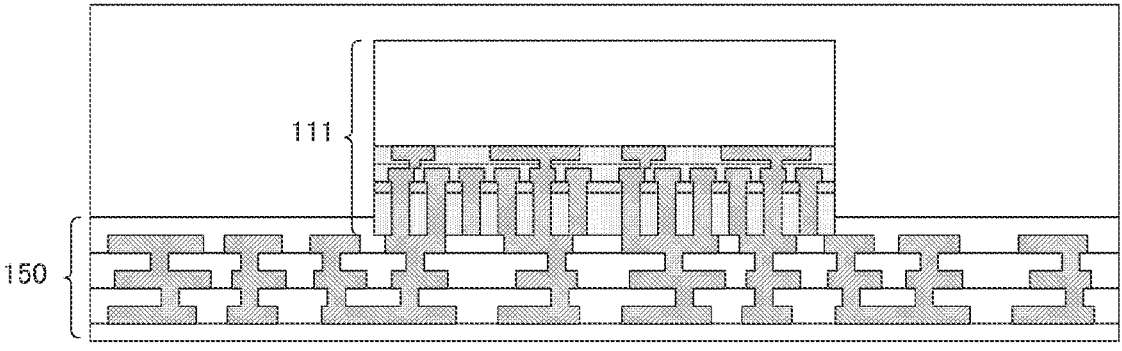
FIG. 32 is an example of a sectional view of a semiconductor device including a fine pitch ball grid array (FBGA) package according to the seventh embodiment of the present technology.

Note that, as illustrated in FIG. 32, the wiring pattern of FIG. 3 or the like can be also applied to the wiring layer 150 of an interposer substrate of an FBGA package adopting a flip-chip connection by a C4 bump.

Figure 33:
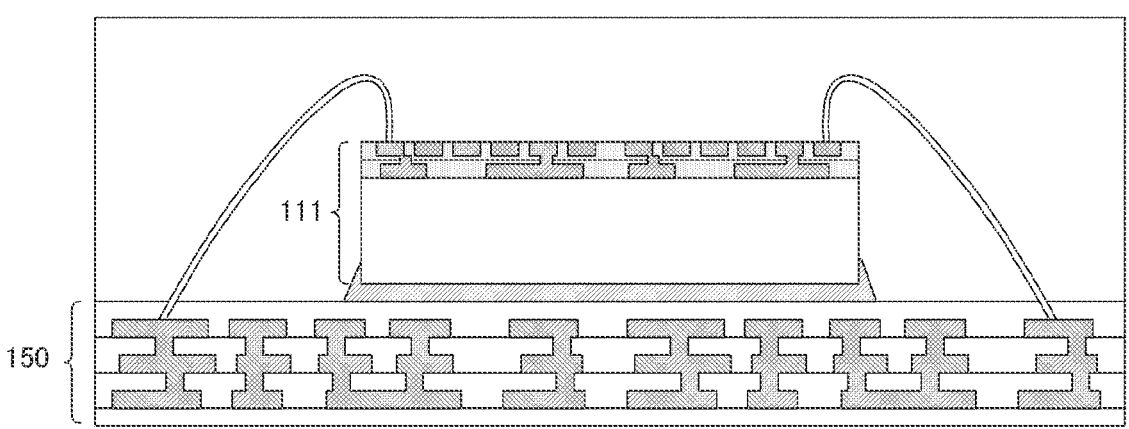
FIG. 33 is an example of a sectional view of a semiconductor device including an interposer substrate according to the seventh embodiment of the present technology.

In addition, as illustrated in FIG. 33, the wiring pattern of FIG. 3 or the like can be also applied to the wiring layer 150 of an interposer substrate of an FBGA package adopting a wire bonding connection.

Figure 34:
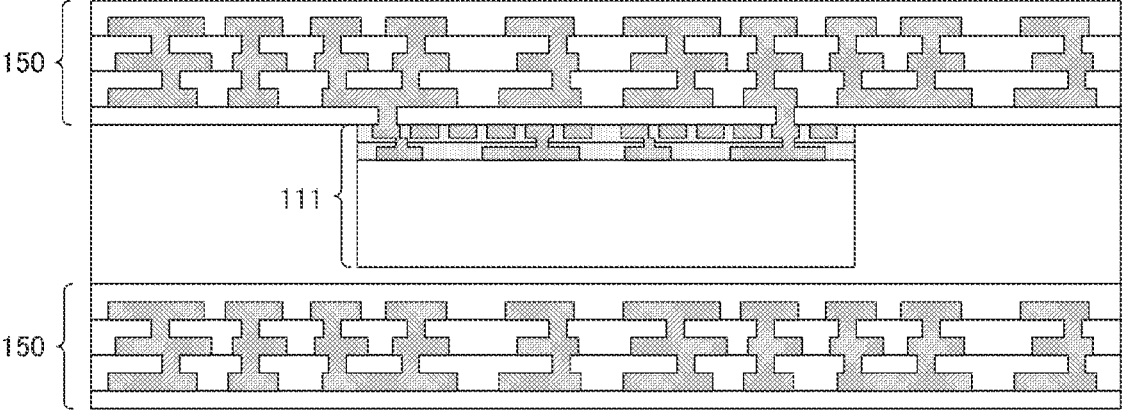
FIG. 34 is an example of a sectional view of a semiconductor device in which a semiconductor die is disposed in a wiring layer according to the seventh embodiment of the present technology.

In addition, the wiring pattern of FIG. 3 or the like can also be applied to an IC mounting substrate illustrated in FIG. 34. The integrated circuit die 111 is provided inside the wiring layer 150 of the IC mounting substrate, and the wiring pattern of FIG. 3 or the like is applied to the wiring path disposed in a region facing the integrated circuit die 111.

Note that the first to sixth embodiments and the modifications of the first to sixth embodiments can also be applied to the seventh embodiment.

As described above, in the seventh embodiment of the present technology, in the WCSP or the like, the WCSP or the like is divided into a plurality of segments including a segment whose angle with the boundary line is less than a predetermined angle, and the signal line is wired across the boundary line. Therefore, the reliability of the WCSP or the like can be improved.

8. Example of Application to Mobile Body

The technology of the present disclosure (the present technology) can be applied to various products. For example, the technology of the present disclosure may be implemented as a device mounted on any type of mobile body such as an automobile, an electric vehicle, a hybrid electric vehicle, a motorcycle, a bicycle, a personal mobility, an airplane, a drone, a ship, a robot, and the like.

Figure 35:
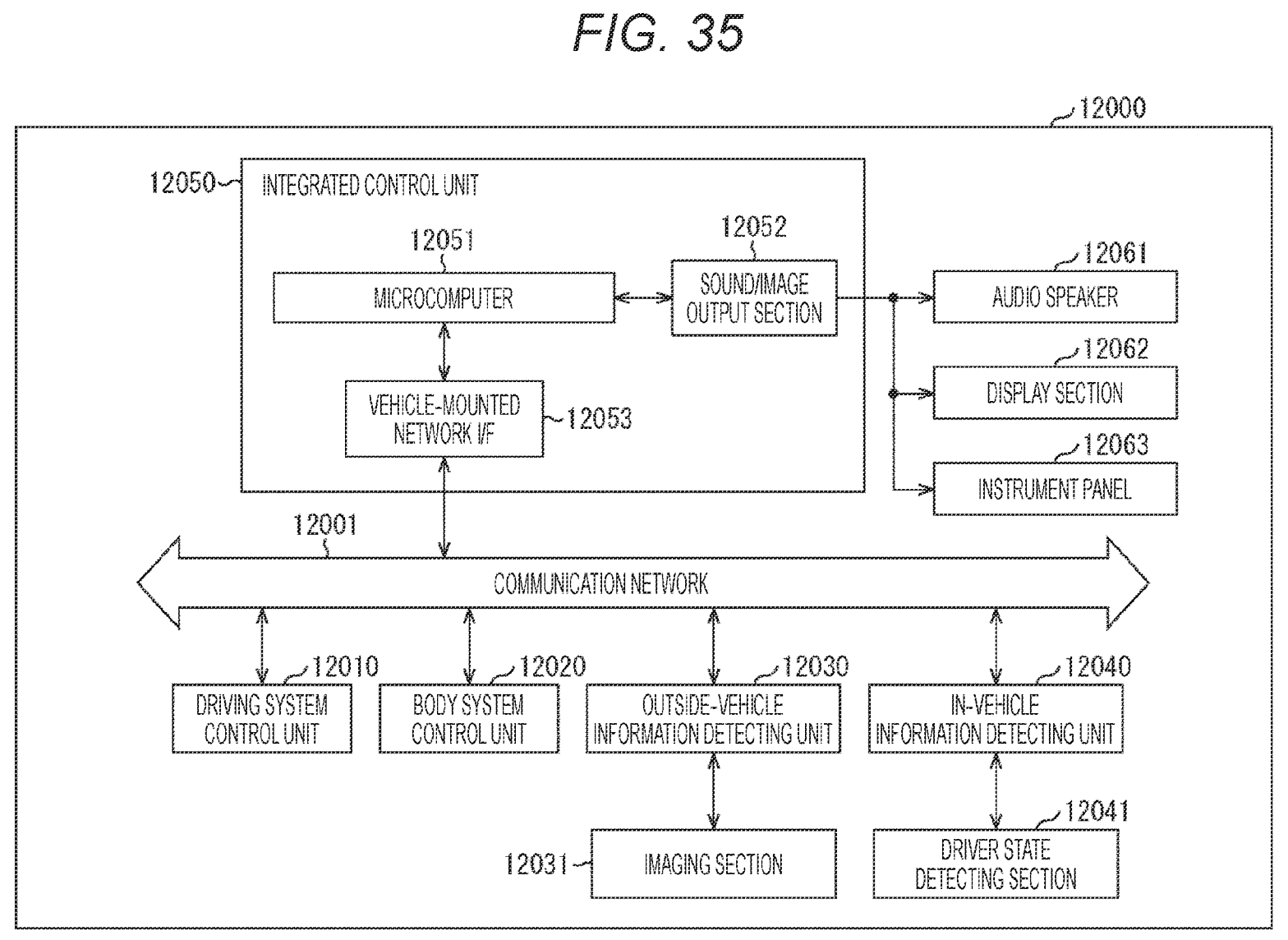

FIG. 35 is a block diagram depicting a schematic configuration example of a vehicle control system that is an example of a mobile object control system to which the technology according to the present disclosure can be applied.

The vehicle control system 12000 includes a plurality of electronic control units connected to each other via a communication network 12001. In the example depicted in FIG. 35, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are shown as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of the information about the outside of the vehicle obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 35, an audio speaker 12061, a display section 12062, and an instrument panel 12063 are illustrated as output devices. The display section 12062 may, for example, include at least one of an on-board display and a head-up display.

Figure 36:
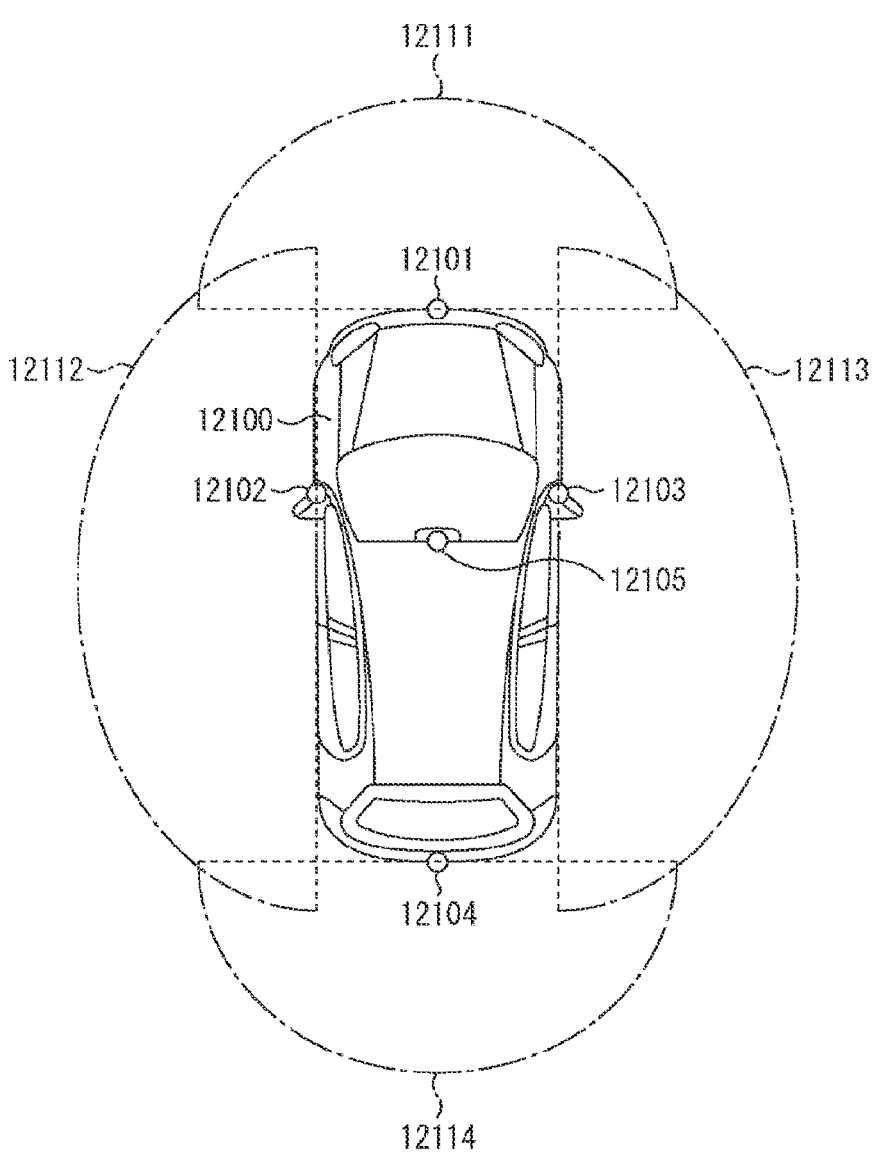
FIG. 36 is a diagram depicting an example of an installation position of an imaging section.

FIG. 36 is a diagram depicting an example of an installation position of the imaging section 12031.

In FIG. 36, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within an interior of the vehicle, and the like. The imaging section 12101 provided to the front nose and the imaging section 12105 provided to the upper portion of the windshield within the interior of the vehicle obtain mainly an image of the front of the vehicle 12100. The imaging sections 12102 and 12103 provided on the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 36 depicts an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology of the present disclosure can be applied has been described above. The technology of the present disclosure can be applied to, for example, the imaging section 12031 among the above-described configurations. Specifically, the semiconductor device 500 in FIG. 1 can be applied to the imaging section 12031. By applying the technology according to the present disclosure to the imaging section 12031, it is possible to improve the reliability of the imaging section 12031 and the safety of the system.

Note that the above embodiments show examples for embodying the present technology, and the matters in the embodiments and the matters specifying the invention in the claims have a corresponding relationship with each other. Similarly, the matters specifying the invention within the claims and the matters in the embodiments of the present technology having the same names have a corresponding relationship with each other. However, the present technology is not limited to the embodiments, and can be embodied by applying various modifications to the embodiments without departing from the gist of the embodiments.

Note that the effects herein described are merely examples and are not limited, and furthermore, other effects may be obtained.

Note that the present technology can have the following configurations.

(1) A semiconductor device includes
a wiring layer,
a semiconductor chip stacked in a predetermined region on a wiring surface of the wiring layer, and
a signal line that is wired on the wiring surface and has an angle less than a predetermined angle in at least one of two regions divided by any boundary line of the predetermined region, the angle being formed when the signal line crosses the boundary line.

(2) In the semiconductor device according to (1),
the signal line includes a predetermined number of segments, and
any of the predetermined number of segments intersects the boundary line and has an angle with respect to the boundary line, the angle being less than the predetermined angle.

(3) In the semiconductor device according to (1),
the signal line includes a predetermined number of segments, and one end of any of the predetermined number of segments substantially coincides with a predetermined point on the boundary line and has an angle with respect to the boundary line, the angle being less than the predetermined angle.

(4) In the semiconductor device according to any of (1) to (3),
the signal line includes a plurality of segments including a specific segment whose angle with respect to the boundary line is less than the predetermined angle, and a width of the specific segment among the plurality of segments is wider than a width of a segment that does not correspond to the specific segment among the plurality of segments.

(5) In the semiconductor device according to any of (1) to (4),
the signal line includes a predetermined number of segments, and
an angle between the boundary line and all of the segments in a region where a distance from the boundary line is within a predetermined value is less than the predetermined angle.

(6) In the semiconductor device according to any of (1) to (5),
the signal line connects a pair of terminals, and
a redundant signal line connecting the pair of terminals and having a different wiring path from the signal line is further wired in the wiring layer.

(7) In the semiconductor device according to (6), the signal line is wired via a relay via provided on the boundary line.

(8) The semiconductor device according to any of (1) to (7) further includes
a dielectric layer provided with an external terminal, a conductive material of which one of both surfaces is connected to the external terminal, and a seed layer,
in which another of the both surfaces of the conductive material has a first portion in contact with the dielectric layer and a second portion in non-contact with the seed layer.

(9) In the semiconductor device according to (8), an end surface of the conductive material is tapered.

(10) In the semiconductor device according to (8) or (9), the conductive material includes a plurality of lands and linear lines.

(11) In the semiconductor device according to any of (1) to (10), the wiring layer includes
a signal line region in which the signal line is wired, and
a power supply ground region to which at least one of a power supply or a ground to the semiconductor chip is supplied.

(12) In the semiconductor device according to (11), at least one of a power supply line or a ground line is wired in a mesh shape in the power supply ground region.

(13) In the semiconductor device according to (11), a solid pattern is formed in the power supply ground region.

(14) In the semiconductor device according to any of (11) to (13), an angle formed by a boundary between each of the signal line region and the power supply ground region and the boundary line is different from 90 degrees.

(15) In the semiconductor device according to any of (1) to (14), the wiring layer and the semiconductor chip are provided in a wafer level chip size package (WCSP).

(16) In the semiconductor device according to any of (1) to (14), the wiring layer and the semiconductor chip are provided in a fine pitch ball grid array (FBGA) package.

(17) In the semiconductor device according to any of (1) to (15), the wiring layer is formed in an interposer substrate.

REFERENCE SIGNS LIST

101 Carrier substrate
102 Release layer
103, 105, 121 to 124 Dielectric layer
104, 125 to 127 Wiring pattern
106, 306 Through via
107 Backside rewiring layer
111 Integrated circuit die
112 Adhesive
113 Semiconductor substrate
114 Interconnect structure
115 Pad
116 Passivation film
117 Die connector
118 Dielectric material
119 Encapsulant
120 Frontside rewiring layer
128 Power supply ground region
129 Signal line region
126-1 to 126-6 Signal line
131-1 to 131-4 Conductive via
141 Relay via
142 Under bump metal
143, 314 Conductive connector
144 Tape
150 Wiring layer
200, 300 Package
240 Conductive material
243 Line
244 Land
245 Seed layer
246 External terminal
302 Substrate
303, 304, 402 Bond pad
308-1, 308-2 Stacked die
400 Package substrate
500 Semiconductor device
600, 601 Package region
12031 Imaging section

The invention claimed is:

1. A semiconductor device, comprising:
a wiring layer having a wiring surface;
a semiconductor chip stacked in a defined region on a the wiring surface; and
a signal line wired on the wiring surface and crossing at least one boundary line of the stacked semiconductor chip,
wherein an angle formed between the signal line and the boundary line at the crossing is less than a reference angle,
wherein the signal line includes a plurality of segments, wherein at least one segment intersects the boundary line at an endpoint located on the boundary line and forms an angle with respect to the boundary line that is less than the reference angle,
wherein adjacent segments of the plurality of segments form a non-zero angle with each other, and wherein no pair of adjacent segments is collinear.

2. The semiconductor device according to claim 1, wherein
each segment that intersects the boundary line forms an angle with the boundary line that is, less than the reference angle.

3. The semiconductor device according to claim 1, wherein
the signal line first segment that forms an angle the boundary line less than the reference angle, and
a width of the first segment is greater than a width of at least one other segment of the signal line.

4. The semiconductor device according to claim 1, wherein
each segment located within a predetermined distance from the boundary line forms an angle with the boundary line that is less than the reference angle.

5. The semiconductor device according to claim 1, wherein
the signal line connects a pair of terminals, and
a redundant signal line connecting the pair of terminals along a different wiring path is further provided in the wiring layer.

6. The semiconductor device according to claim 5, wherein the signal line is wired through a via located on the boundary line.

7. The semiconductor device according to claim 1, further comprising
a dielectric layer;
an external terminal disposed on the dielectric layer;
a conductive member having opposed first and second surfaces;
and a seed layer,
wherein the first surface of the conductive member is connected to the external terminal, and
wherein the second surface of the conductive member includes a first region in contact with the dielectric layer and a second region not in contact with the seed layer.

8. The semiconductor device according to claim 7, wherein an end surface of the conductive member is tapered.

9. The semiconductor device according to claim 7, wherein the conductive member includes a plurality of lands and linear lines.

10. The semiconductor device according to claim 1, wherein the wiring layer includes
a signal line region in which the signal line is wired, and
a power supply ground region configured to supply power voltage or a ground to the semiconductor chip.

11. The semiconductor device according to claim 10, wherein at least one of a power supply line or a ground line in the power supply ground region is formed as a mesh pattern.

12. The semiconductor device according to claim 10, wherein the power supply ground region includes a solid conductive pattern.

13. The semiconductor device according to claim 10, wherein an angle formed between a boundary separating the signal line region and the power supply ground region and the boundary line is not equal to 90 degrees.

14. The semiconductor device according to claim 1, wherein the wiring layer and the semiconductor chip are included in a wafer level chip size package (WCSP).

15. The semiconductor device according to claim 1, wherein the wiring layer and the semiconductor chip are includes in a fine pitch ball grid array (FBGA) package.

16. The semiconductor device according to claim 1, wherein the wiring layer is formed in an interposer substrate.

17. A semiconductor device, comprising:

a wiring layer having a wiring surface;

a semiconductor chip stacked in a defined region on the wiring surface; and a signal line wired on the wiring surface and crossing at least one boundary line of the stacked semiconductor chip, wherein an angle formed between the signal line and the boundary line at the crossing is less than a reference angle, wherein the signal line includes a plurality of segments, wherein the plurality of segments includes three segments, wherein at least one segment intersects the boundary line at an endpoint located on the boundary line and forms an angle with respect to the boundary line that is less than the reference angle, wherein adjacent segments of the plurality of segments form a non-zero angle with each other, and wherein no pair of adjacent segments is collinear.

18. The semiconductor device according to claim 17, wherein each segment that intersects the boundary line forms an angle with the boundary line that is less than the reference angle.

19. A semiconductor device, comprising:

a wiring layer having a wiring surface;

a semiconductor chip stacked in a defined region on the wiring surface; and a signal line wired on the wiring surface and crossing at least one boundary line of the stacked semiconductor chip, wherein an angle formed between the signal line and the boundary line at the crossing is less than a reference angle, wherein the reference angle is 50 degrees, wherein the signal line includes a plurality of segments, wherein the plurality of segments includes three segments, wherein at least one segment intersects the boundary line at an endpoint located on the boundary line and forms an angle with respect to the boundary line that is less than the reference angle, wherein adjacent segments of the plurality of segments form a non-zero angle with each other, and wherein no pair of adjacent segments is collinear.

20. The semiconductor device according to claim 18, wherein each segment that intersects the boundary line forms an angle with the boundary line that is less than the reference angle.

* * * * *